United States Patent
Shiibayashi et al.

(10) Patent No.: US 11,862,070 B2
(45) Date of Patent: Jan. 2, 2024

(54) SOURCE DRIVER AND DISPLAY DEVICE

(71) Applicant: LAPIS Technology Co., Ltd., Yokohama (JP)

(72) Inventors: Kenichi Shiibayashi, Yokohama (JP); Kenichi Shigeta, Yokohama (JP)

(73) Assignee: LAPIS Technology Co., Ltd., Yokohama (JP)

( * ) Notice: Subject to any disclaimer, the term of this patent is extended or adjusted under 35 U.S.C. 154(b) by 0 days.

(21) Appl. No.: 17/693,393

(22) Filed: Mar. 13, 2022

(65) Prior Publication Data

US 2022/0319403 A1 Oct. 6, 2022

(30) Foreign Application Priority Data

Mar. 30, 2021 (JP) .................................. 2021-056868
Sep. 28, 2021 (JP) .................................. 2021-157992

(51) Int. Cl.
*G09G 3/32* (2016.01)
*H03F 3/04* (2006.01)
*G02F 1/1362* (2006.01)

(52) U.S. Cl.
CPC .................. *G09G 3/32* (2013.01); *H03F 3/04* (2013.01); *G02F 1/136286* (2013.01); *G09G 2310/027* (2013.01); *G09G 2310/0291* (2013.01); *G09G 2330/12* (2013.01)

(58) Field of Classification Search
CPC ............... G09G 3/32; G09G 2310/027; G09G 2310/0291; G09G 2330/12; H03F 3/04; G02F 1/136286
See application file for complete search history.

(56) References Cited

U.S. PATENT DOCUMENTS

| | | | |
|---|---|---|---|
| 2010/0123690 A1* | 5/2010 | Jeon ...................... | G09G 3/3688 345/204 |
| 2016/0379548 A1* | 12/2016 | Shin ..................... | G09G 3/2096 345/214 |
| 2018/0308443 A1* | 10/2018 | Yamagishi ........... | G09G 3/3685 |
| 2019/0279585 A1* | 9/2019 | Suzuki ................ | G02F 1/13306 |

FOREIGN PATENT DOCUMENTS

WO    2018079636    5/2018

* cited by examiner

*Primary Examiner* — Kenneth B Lee, Jr.
(74) *Attorney, Agent, or Firm* — JCIPRNET

(57) ABSTRACT

A source driver includes: a first gradation voltage generation unit generating a gradation voltage of a first polarity supplied to a pixel on a first source line; a first amplifier receiving the gradation voltage of the first polarity to an input end, amplifying it, and outputting a voltage from an output end; a second gradation voltage generation unit generating a gradation voltage of a second polarity opposite to the first polarity to be supplied to a pixel on a second source line provided in the vicinity of the first source line; a second amplifier receiving the gradation voltage of the second polarity to an input end, amplifying it, and outputting a voltage from an output end; and a voltage comparison unit comparing a voltage of the input end of the second amplifier with the voltage of the output end of the second amplifier and outputs a comparison result.

22 Claims, 13 Drawing Sheets

SOURCE DRIVER AND DISPLAY DEVICE

CROSS-REFERENCE TO RELATED APPLICATION

This application claims priority under 35 USC 119 from Japanese Patent application No. 2021-056868 filed on Mar. 30, 2021 and Japanese Patent application No. 2021-157992 filed on Sep. 28, 2021, the disclosure of which is incorporated by reference herein.

BACKGROUND

Technical Field

The disclosure relates to a source driver and a display device.

Related Art

An active matrix drive type is adopted as a drive type for a display device composed of a display device such as a liquid crystal display or an organic electro luminescence (EL). In an active matrix drive type display device, a display panel is composed of a semiconductor substrate in which pixel units and pixel switches are arranged in a matrix shape. A display is performed in such a manner that the pixel switch is controlled to be turned on and off by a gate signal from a gate driver and a drive signal corresponding to a video data signal is supplied to the pixel unit in an on state of the pixel switch to control the luminance of each pixel unit. For example, a source driver applies an analog voltage to a horizontal column of pixels selected by the gate driver to display the horizontal column and this operation is repeated in the vertical direction by changing the selected pixel column, so that a screen of one frame is displayed.

In recent years, a demand for a display device having a high-resolution and large-screen display panel such as 4K panel (pixel column: 3840×RGB, pixel row: 2160) and 8K panel (pixel column and pixel row twice that of 4K panel) is increasing as a display device used for TVs and monitors. Due to such high resolution, the number of data lines driven by the source driver is increasing.

When the number of data lines increases, short-circuit are likely to occur between adjacent channels when mounting the display panel. If the reliability evaluation test of the display panel is performed with the data line short-circuited, there is a risk that the display panel and driver IC will be destroyed due to overcurrent. Therefore, it is necessary to check whether the adjacent channel is short-circuited before performing the reliability evaluation.

As a device for inspecting the presence or absence of the short-circuit between adjacent channels of such data lines, there are proposed a display device and an inspection method that determine a voltage level of an output signal of a motor connected to a source line and compare the determination result with an expected value by a comparison circuit provided outside a driver to detect the presence or absence of the short-circuit (for example, International Publication No. 2018/079636).

In the inspection method like the above-described conventional technique, since it is necessary to provide the comparison circuit outside the driver, there is a problem that the cost for the inspection IC increases. Further, in the inspection method of the above-described conventional technique, since the comparison circuit performs measurement and determination while switching the voltage of all source lines with a switch, there is a problem that the inspection takes time and effort.

The disclosure provides a source driver capable of promptly detecting the presence or absence of a short-circuit in a data line with a simple configuration.

SUMMARY

A source driver according to the disclosure is a source driver which is connected to a display panel including a plurality of source lines and a plurality of pixel units connected to the plurality of source lines, receives a video data signal including a series of pixel data pieces, and outputs a gradation voltage to be applied to the plurality of pixel units based on the video data signal, the source driver including: a first gradation voltage generation unit which generates a gradation voltage of a first polarity to be supplied to a pixel on a first source line of the plurality of source lines; a first amplifier which receives an input of the gradation voltage of the first polarity to an input end, amplifies the gradation voltage of the first polarity, and outputs a voltage from an output end; a second gradation voltage generation unit which generates a gradation voltage of a second polarity corresponding to a polarity opposite to the first polarity to be supplied to a pixel on a second source line corresponding to a source line provided in the vicinity of the first source line; a second amplifier which receives an input of the gradation voltage of the second polarity to an input end, amplifies the gradation voltage of the second polarity, and outputs a voltage from an output end; and a voltage comparison unit which compares a voltage of the input end of the second amplifier with a voltage of the output end of the second amplifier and outputs a comparison result.

Further, a source driver according to the disclosure is a source driver which is connected to a display panel including a plurality of source lines and a plurality of pixel units connected to the plurality of source lines, receives a video data signal including a series of pixel data pieces, and outputs a gradation voltage to be applied to the plurality of pixel units based on the video data signal, the source driver including: a first gradation voltage generation unit which generates a gradation voltage of a first polarity to be supplied to a pixel on a first source line of the plurality of source lines; a first amplifier which receives an input of the gradation voltage of the first polarity to an input end, amplifies the gradation voltage of the first polarity, and outputs a voltage from an output end; a first source output terminal which outputs the voltage output from the first amplifier to the first source line; a first resistor element which is provided between the first amplifier and the first source output terminal and of which one end is connected to the output end of the first amplifier and the other end is connected to the first source output terminal; a second gradation voltage generation unit which generates a gradation voltage of a second polarity corresponding to a polarity opposite to the first polarity to be supplied to a pixel on a second source line corresponding to a source line provided in the vicinity of the first source line; a second amplifier which receives an input of the gradation voltage of the second polarity to an input end, amplifies the gradation voltage of the second polarity, and outputs a voltage from an output end; a second source output terminal which outputs the voltage output from the second amplifier to the second source line; a second resistor element which is provided between the second amplifier and the second source output terminal and of which one end is connected to the output end of the second amplifier and the other end is connected to the second source output terminal;

and a voltage comparison unit which compares a voltage of the output end of the second amplifier with a voltage of a connection node between the other end of the second resistor element and the second source output terminal and outputs a comparison result.

Further, a display device according to the disclosure is a source driver which is connected to a display panel including a plurality of source lines and a plurality of gate lines and a plurality of pixel units respectively provided in a matrix shape at intersection portions between the plurality of source lines and the plurality of gate lines, receives a video data signal including a series of pixel data pieces, and outputs a gradation voltage to be applied to the plurality of pixel units based on the video data signal, the source driver including: a first gradation voltage generation unit which generates a gradation voltage of a first polarity to be supplied to a pixel on a first source line of the plurality of source lines; a first amplifier which receives an input of the gradation voltage of the first polarity to an input end, amplifies the gradation voltage of the first polarity, and outputs a voltage from an output end; a first source output terminal which outputs the voltage output from the first amplifier to the first source line; a first resistor element which is provided between the first amplifier and the first source output terminal and of which one end is connected to the output end of the first amplifier and the other end is connected to the first source output terminal; a second gradation voltage generation unit which generates a gradation voltage of a second polarity corresponding to a polarity opposite to the first polarity to be supplied to a pixel on a second source line corresponding to a source line provided in the vicinity of the first source line; a second amplifier which receives an input of the gradation voltage of the second polarity to an input end, amplifies the gradation voltage of the second polarity, and outputs a voltage from an output end; a second source output terminal which outputs the voltage output from the second amplifier to the second source line; a second resistor element which is provided between the second amplifier and the second source output terminal and of which one end is connected to the output end of the second amplifier and the other end is connected to the second source output terminal; and a voltage comparison unit which compares a voltage of the output end of the second amplifier with a voltage of a connection node between the other end of the second resistor element and the second source output terminal and outputs a comparison result.

Further, a display device according to the disclosure is a display device including: a display panel which includes a plurality of source lines and a plurality of gate lines and a plurality of pixel units respectively provided in a matrix shape at intersection portions of the plurality of source lines and the plurality of gate lines; and a source driver which receives a video data signal including a series of pixel data pieces and outputs a gradation voltage to be applied to the plurality of pixel units based on the video data signal, the source driver including: a first gradation voltage generation unit which generates a gradation voltage of a first polarity to be supplied to a pixel on a first source line of the plurality of source lines, a first amplifier which receives an input of the gradation voltage of the first polarity to an input end, amplifies the gradation voltage of the first polarity, and outputs a voltage from an output end, a first source output terminal which outputs the voltage output from the first amplifier to the first source line, a first resistor element which is provided between the first amplifier and the first source output terminal and of which one end is connected to the output end of the first amplifier and the other end is connected to the first source output terminal, a second gradation voltage generation unit which generates a gradation voltage of a second polarity corresponding to a polarity opposite to the first polarity to be supplied to a pixel on a second source line corresponding to a source line provided in the vicinity of the first source line, a second amplifier which receives an input of the gradation voltage of the second polarity to an input end, amplifies the gradation voltage of the second polarity, and outputs a voltage from an output end, a second source output terminal which outputs the voltage output from the second amplifier to the second source line, a second resistor element provided between the second amplifier and the second source output terminal and of which one end is connected to the output end of the second amplifier and the other end is connected to the second source output terminal, and a voltage comparison unit which compares a voltage of the output end of the second amplifier with a voltage of a connection node between the other end of the second resistor element and the second source output terminal and outputs a comparison result.

DETAILED DESCRIPTION

Figure 1:
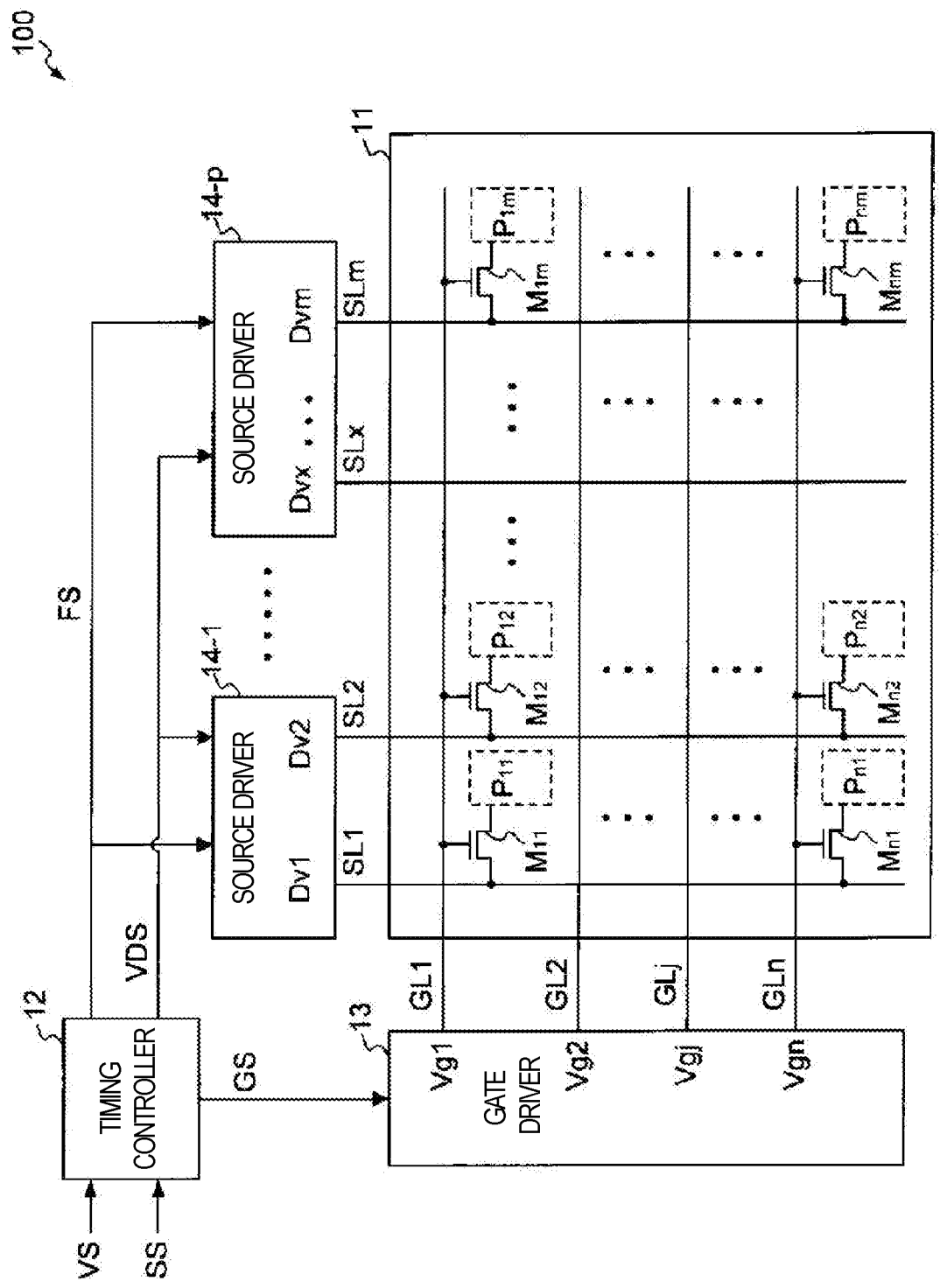
FIG. 1 is a block diagram showing a configuration of a display device according to the disclosure.

Hereinafter, exemplary embodiments of the disclosure will be described in detail. Additionally, in the description and the accompanying drawings in each of the following embodiments, substantially the same or equivalent parts are designated by the same reference numerals.

First Embodiment

FIG. 1 is a block diagram showing a configuration of a display device 100 according to the disclosure. The display device 100 is an active matrix drive type liquid crystal display device. The display device 100 includes a display panel 11, a timing controller 12, a gate driver 13, and a source driver 14.

The display panel 11 is composed of a semiconductor substrate in which a plurality of pixel units $P_{11}$ to $P_{nm}$ and pixel switches $M_{11}$ to $M_{nm}$ (natural numbers of n, m: 2 or more) are arranged in a matrix. The display panel 11 includes n gate lines GL1 to GLn, each of which is a scanning line extending in the horizontal direction, and m source lines SL1 to SLm arranged to intersect the gate lines GL1 to GLn. The pixel units $P_{11}$ to $P_{nm}$ and the pixel switches $M_{11}$ to $M_{nm}$ are provided at the intersections of the gate lines GL1 to GLn and the source lines SL1 to SLm.

The pixel switches $M_{11}$ to $M_{nm}$ are controlled to be turned on or off according to gate signals Vg1 to Vgn supplied from the gate driver 13.

The pixel units $P_{11}$ to $P_{nm}$ receive a drive voltage (gradation voltage) corresponding to the video data from the source driver 14. Specifically, drive voltage signals Dv1 to Dvm are output from the source driver 14 to the source lines SL1 to SLm and when the pixel switches $M_{11}$ to $M_{nm}$ are respectively turned on, the drive voltage signals Dv1 to Dvm are applied to the pixel units $P_{11}$ to $P_{nm}$. Accordingly, each of the pixel electrodes of the pixel units $P_{11}$ to $P_{nm}$ is charged and the luminance is controlled.

When the display device 100 is a liquid crystal display device, the pixel units $P_{11}$ to $P_{nm}$ respectively include transparent electrodes connected to the source lines SL1 to SLm via the pixel switches $M_{11}$ to $M_{nm}$ and a liquid crystal enclosed between a facing substrate provided facing the semiconductor substrate and having one transparent electrode formed on the entire surface. A display is performed by changing the transmittance of the liquid crystal with respect to the backlight inside the display device according to the potential difference between the drive voltage (gradation voltage) applied to the pixel units $P_{11}$ to $P_{nm}$ and the facing substrate voltage.

The timing controller 12 generates a series (serial signal) of pixel data pieces PD that represent the luminance level of each pixel in, for example, 8-bit 256-stage luminance gradation on the basis of the video data VS. Further, the timing controller 12 generates an embedded clock system clock signal CLK having a constant clock period on the basis of the synchronization signal SS. The timing controller 12 generates a video data signal VDS which is a serial signal in which a series of pixel data pieces PD and a clock signal CLK are integrated, and supplies the video data signal VDS to the source driver 14 to control the display of video data. The video data signal VDS is configured as a video data signal serialized according to the number of transmission lines for each predetermined number of source lines.

In this embodiment, the video data signal VDS for one frame is configured by serially continuing n pixel data pieces, each of which consists of m pixel data pieces PD. Each of the n pixel data piece groups is a pixel data piece group consisting of pixel data pieces corresponding to the gradation voltage to be supplied to the pixels on each one horizontal scanning line (that is, each of the gate lines GL1 to GLn). By the operation of the source driver 14, the drive voltage signals Dv1 to Dvm to be supplied to n×m pixel units (that is, pixel units $P_{11}$ to $P_{nm}$) are applied via the source line on the basis of the m×n pixel data pieces PD.

Further, the timing controller 12 generates a frame synchronization signal FS indicating the timing of each frame of the video data signal VDS on the basis of the synchronization signal SS, and supplies the frame synchronization signal FS to source drivers 14-1 to **14-*p***.

Further, the timing controller 12 generates a gate timing signal GS that controls the operation timing of the gate driver 13 on the basis of the synchronization signal SS, and supplies the gate timing signal GS to the gate driver 13.

The gate driver 13 receives a gate control signal GS from the timing controller 12 and sequentially supplies the gate signals Vg1 to Vgn to the gate lines GL1 to GLn on the basis of the clock timing included in the gate control signal GS. By supplying the gate signals Vg1 to Vgn, the pixel units $P_{11}$ to Prim are selected for each pixel row. Then, the gradation voltage is written to the pixel electrode by applying the drive voltage signals Dv1 to Dvm from the source driver 14 to the selected pixel unit.

In other words, m pixel units arranged along the extension direction of the gate line (that is, a horizontal column) are selected as the supply target of drive voltage signals Gv1 to Gvm by the operation of the gate driver 13. The source driver 14 applies the drive voltage signals Gv1 to Gvm to the selected horizontal column of pixel units to display a color corresponding to the voltage. The screen display for one frame is performed by repeating the application of the drive voltage signals in the extension direction (that is, the vertical direction) of the data line while selectively switching the pixel unit for one horizontal column selected as the supply target of the drive voltage signals Gv1 to Gvm.

The source drivers 14-1 to **14-*p* receive the video data signal VDS from the timing controller 12**, generate the drive voltage signals Dv1 to Dvm corresponding to a multi-valued level gradation voltage according to the number of gradation shown in the video data signal VDS, and applies the drive voltage signals to the pixel units $P_{11}$ to $P_{nm}$ via the source lines SL1 to SLm. Additionally, in the following description, the drive voltage signals Dv1 to Dvm are referred to as gradation voltage signals Dv1 to Dvm. Further, one of the gradation voltage signals Dv1 to Dvm is also simply referred to as a gradation voltage signal Dv.

The source drivers 14-1 to **14-*p* are provided for each of a predetermined number of source lines obtained by dividing the source lines SL1 to SLm. The number of source lines driven by each source driver corresponds to the number of output channels of the source driver. For example, if one source driver has an output of 960 channels and the display panel has one source line per pixel column, the source line is driven by 12 source drivers for the 4K panel and 24 source drivers for the 8K panel. Each of the source drivers 14-1 to 14-*p*** is formed on different semiconductor integrated circuit (IC) chips.

Each of the source drivers 14-1 to **14-*p* has a common configuration. In the following description, the source drivers 14-1 to 14-*p* are collectively simply referred to as the "source driver 14**" when describing such a common configuration.

Figure 2:
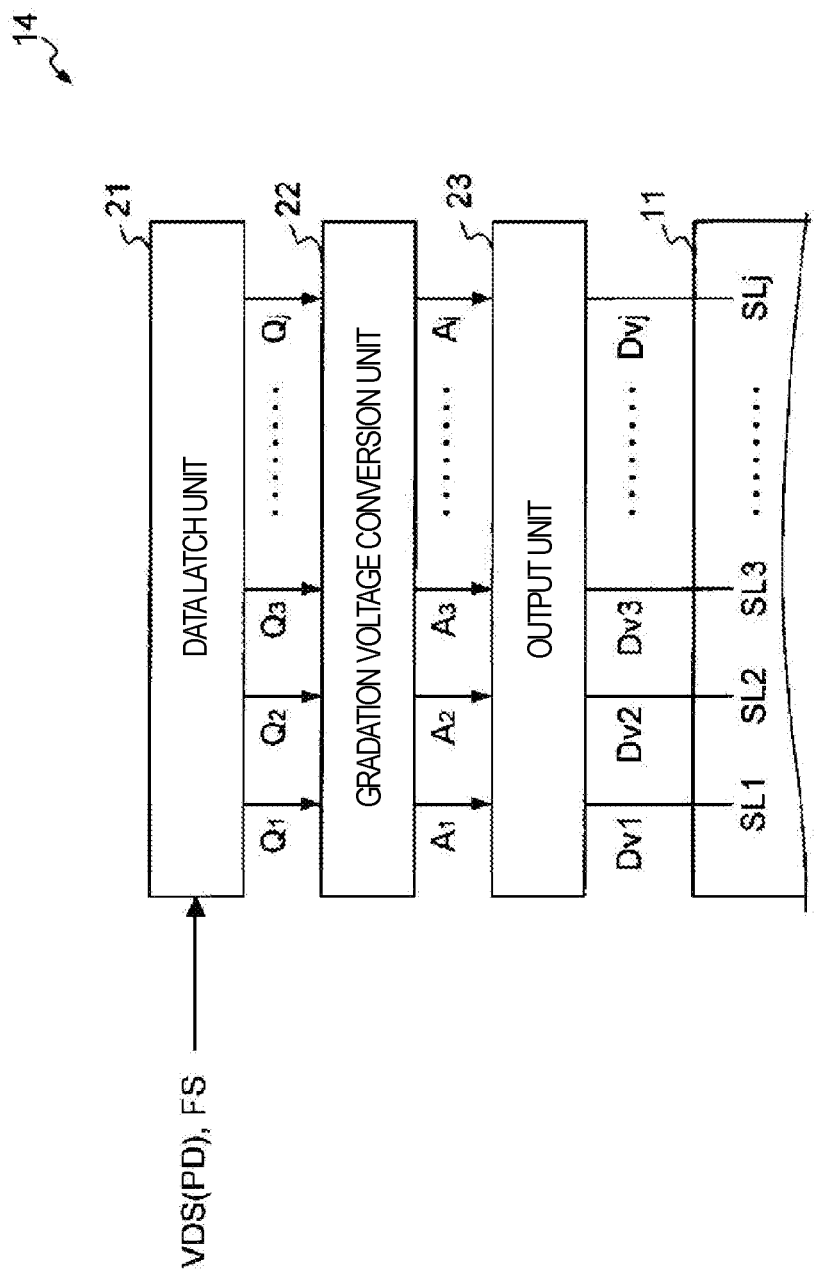
FIG. 2 is a circuit diagram showing a configuration of a source driver according to the disclosure.

FIG. 2 is a block diagram showing an internal configuration of the source driver 14. The source driver 14 includes a data latch unit 21, a gradation voltage conversion unit 22, and an output unit 23.

The data latch unit 21 sequentially captures a series of pixel data pieces PD included in the video data signal VDS supplied from the timing controller 12. Then, the data latch unit 21 outputs the captured pixel data piece PD as pixel data Q1 to Qj to the gradation voltage conversion unit 22 in response to the acquisition of the pixel data piece PD for jch.

The gradation voltage conversion unit 22 converts the pixel data Q1 to Qj supplied from the data latch unit 21 into positive or negative gradation voltages A1 to Aj having voltage values corresponding to the luminance gradation represented by the pixel data and supplies the result to the output unit 23.

The output unit 23 generates a signal obtained by amplifying the gradation voltage A1 to Aj as gradation voltage signals Dv1 to Dvj and outputs the signals to the source line SL1 to SLj.

Further, the output unit 23 has a circuit configuration for detecting whether or not the adjacent channels of the source lines SL1 to SLj are short-circuited.

Additionally, the source lines SL1 to SLj have a configuration in which the source line (hereinafter, referred to as the positive channel) receiving the positive gradation voltage signal Dv and the source line (hereinafter, referred to as the negative channel) receiving the negative gradation voltage signal Dv are alternately arranged. That is, the gradation voltage signals Dv having different polarities are supplied to the adjacent channels of the source lines SL1 to SLj.

The gradation voltage conversion unit 22 includes a positive decoder that generates a positive gradation voltage and a positive amplifier that amplifies and outputs the gradation voltage. Further, the gradation voltage conversion unit 22 includes a negative decoder that generates a negative gradation voltage and a negative amplifier that amplifies and outputs the gradation voltage.

Figure 3:
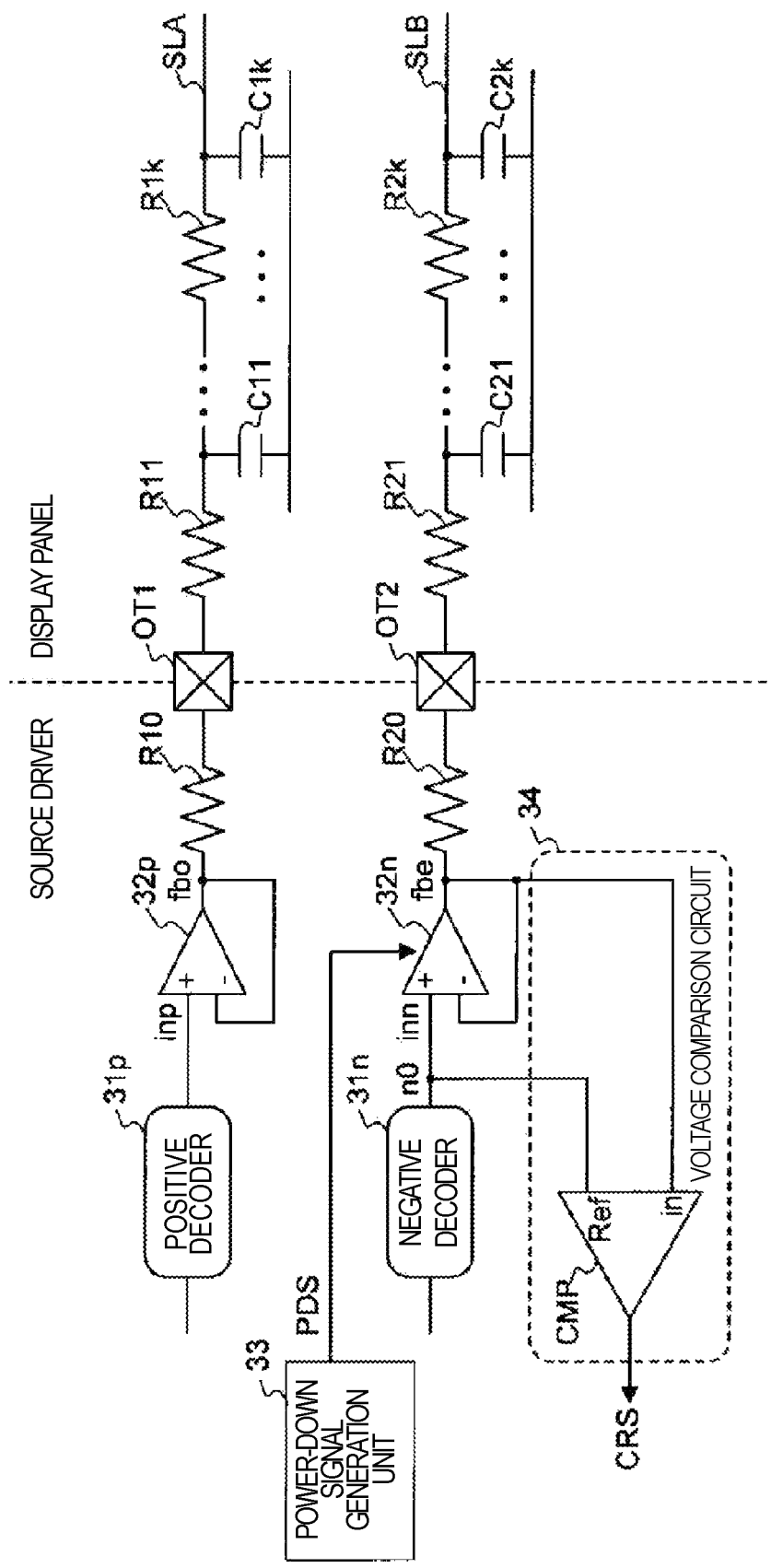
FIG. 3 is a circuit diagram showing a part of an internal configuration of a source driver of a first embodiment.

FIG. 3 is a circuit diagram showing a part of the configuration of the gradation voltage conversion unit 22 and the output unit 23. Additionally, here, a case in which a source line SLA is a positive channel and a source line SLB is a negative channel is shown as an example.

The positive decoder 31p generates a positive gradation voltage (inp in FIG. 3) on the basis of the pixel data Qp and outputs the positive gradation voltage. The output unit of the positive decoder 31p is connected to a non-inverting input terminal of a positive amplifier 32p.

The positive amplifier 32p receives an input of a positive electrode side input voltage inp which is the output voltage of the positive decoder 31p to the non-inverting input terminal and amplifies and outputs the positive input voltage. The output terminal of the positive amplifier 32p is negatively feedback-connected to the inverting input terminal thereof. In the following description, the connection node between the output terminal and the inverting input terminal of the positive amplifier 32p is referred to as a node fbo.

Further, the output terminal of the positive amplifier 32p is connected to one end of a resistor R10 via the node fbo. The resistor R10 is provided in the output unit of the source driver 14 as a protective resistor from electro-static discharge (ESD). The resistor R10 is composed of, for example, a resistor element having a resistance value of 0.2 kΩ. The other end of the resistor R10 is connected to the source output terminal OT1 which is a terminal outputting the positive gradation voltage signal Dv of the source driver 14.

The source output terminal OT1 is connected to the source line SLA of the display panel 11. The source line SLA includes source line loads R11 to R1k and source line capacitances C11 to C1k.

A negative decoder 31n generates a negative gradation voltage (inn in FIG. 3) on the basis of the pixel data Qn and outputs the negative gradation voltage. The output unit of the negative decoder 31n is connected to a non-inverting input terminal of a negative amplifier 32n.

The negative amplifier 32n receives an input of a negative electrode side input voltage inn which is the output voltage of the negative decoder 31n to the non-inverting input terminal and amplifies and outputs the negative input voltage. The output terminal of the negative amplifier 32n is negatively feedback-connected to the inverting input terminal. In the following description, the connection node between the output terminal and the inverting input terminal of the negative amplifier 32n is referred to as a node fbe.

Further, the output terminal of the negative amplifier 32n is connected to one end of the resistor R20 via the node fbe. The resistor R20 is provided in the output unit of the source driver 14 as a protective resistor from ESD similarly to the resistor R10. The resistor R20 is composed of, for example, a resistor element having a resistance value of 0.2 kΩ. The other end of the resistor R20 is connected to the source output terminal OT2 which is a terminal outputting the negative gradation voltage signal Dv by the source driver 14.

The source output terminal OT2 is connected to the source line SLB of the display panel 11. The source line SLB includes source line loads R21 to R2k and source line capacitances C21 to C2k.

Further, the output unit 23 is provided with a power-down signal generation unit 33 and a voltage comparison circuit 34.

The power-down signal generation unit 33 generates power-down signals PDS and XPDS that reduce the drive capability of the negative amplifier 32n and supplies the power-down signals to the negative amplifier 32n. The power-down signals PDS and XPDS of this embodiment are signals that reduce the drive capability of the negative amplifier 32n to 1/10.

Specifically, the negative amplifier 32n of this embodiment is composed of multi-comb (multi-stage) amplifiers in which a plurality of amplifiers is connected in parallel and is able to change the output current by switching the number of amplifier stages. The power-down signals PDS and XPDS are signals for switching the number of stages of such an amplifier.

Figure 4:
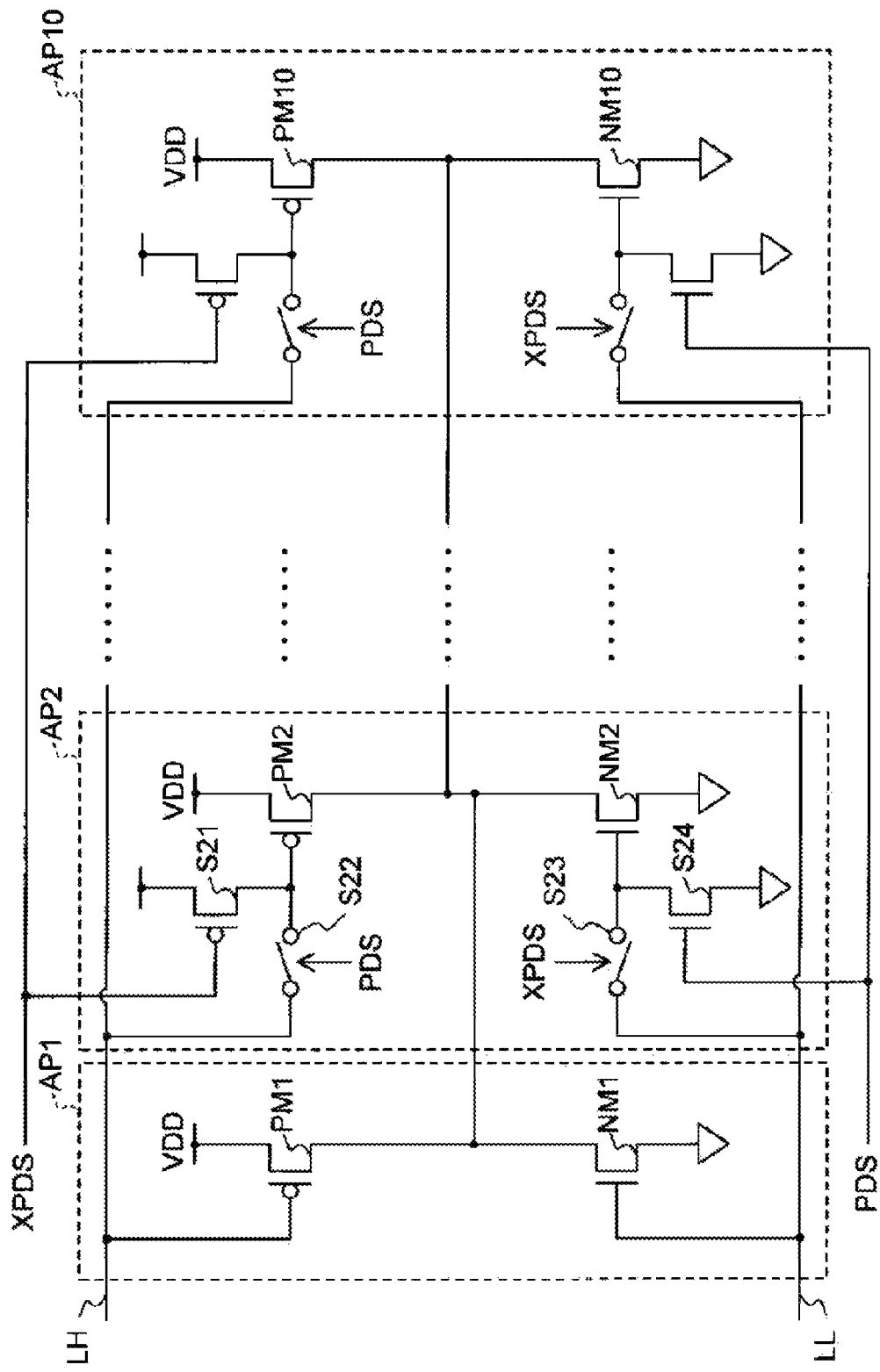
FIG. 4 is a circuit diagram showing a simplified configuration of an amplifier in the source driver.

FIG. 4 is a circuit diagram showing a configuration of an output end 35 of the negative amplifier 32n.

The output end 35 of the negative amplifier 32n is composed of ten combs (ten stages) of amplifiers AP1 to AP10 connected in parallel. The amplifier AP1 of the first stage has a configuration in which the drains of a P-channel type MOS transistor PM1 and a N-channel type MOS transistor NM1 are connected to each other.

In the transistor PM1, the power supply voltage VDD is applied to the source and the gate is connected to a first drive line LH which is the supply line of the positive electrode side drive voltage. In the transistor NM1, the ground potential VSS is applied to the source and the gate is connected to a second drive line LL which is the supply line of the negative electrode side drive voltage.

The amplifiers AP2 to AP10 from the second stage include the P-channel type MOS transistor and the N-channel type MOS transistor connected to each other at the drains thereof and a changeover switch changing the connection/non-connection of the transistors with respect to the first drive line LH and the second drive line LL. The changeover switch switches the connection on the basis of the power-down signals PDS and XPDS. The power-down signal PDS and the power-down signal XPDS are signals whose signal levels complementarily change to a logic level of 0 and a logic level of 1.

In this embodiment, the gate of the P-channel type MOS transistor PM2 of the amplifier AP2 is connected to the first drive line LH via the changeover switch S22. For example, the gate of the P-channel type MOS transistor PM2 is connected to the first drive line LH when the power-down signal PDS has a logic level of 0 and is not connected to the first drive line LH when the power-down signal PDS has a logic level of 1. Further, the gate of the P-channel type MOS transistor PM2 is connected to the drain of the switch transistor S21 composed of the P-channel type MOS transistor. In the switch transistor S21, the power supply voltage VDD is applied to the source and the power-down signal XPDS is applied to the gate. Since the switch transistor S21 is turned on when the power-down signal XPDS has a logic level of 0, the power supply voltage VDD is applied to the gate of the P-channel type MOS transistor PM2. Further, since the switch transistor S21 is turned off when the power-down signal XPDS has a logic level of 1, the power supply voltage VDD is not applied to the gate of the P-channel type MOS transistor PM2 and the positive electrode side drive voltage supplied to the first drive line LH is applied thereto.

Further, the gate of the N-channel type MOS transistor NM2 of the amplifier AP2 is connected to the second drive line LL via the changeover switch S23. The gate of the N-channel type MOS transistor NM2 is connected to the second drive line LL when the power-down signal XPDS has a logic level of 1 and is not connected to the second drive line LL when the power-down signal XPDS has a logic level of 0. Further, the gate of the N-channel type MOS transistor NM2 is connected to the drain of the switch transistor S24 composed of the N-channel type MOS transistor. In the switch transistor S24, the ground voltage VSS is applied to the source and the power-down signal PDS is applied to the gate. Since the switch transistor S24 is turned on when the power-down signal PDS has a logic level of 1, the ground potential VSS is applied to the gate of the N-channel type MOS transistor NM2. Further, since the switch transistor S24 is turned off when the power-down signal PDS has a logic level of 0, the ground potential VSS is not applied to the gate of the N-channel type MOS transistor NM2 and the negative electrode side drive voltage supplied to the second drive line LL is applied thereto.

The amplifiers from the third stage also have the same configuration as that of the amplifier AP2 of the second stage. For example, when the power-down signal PDS has a logic level of 0 and the power-down signal XPDS has a logic level of 1, the amplifier of each stage is connected to the first drive line LH and the second drive line LL and the output end 35 of the negative amplifier 32n has a ten-comb amplifier configuration. On the other hand, when the power-down signal PDS has a logic level of 1 and the power-down signal XPDS has a logic level of 0, only the amplifier AP1 of the first stage is connected to the first drive line LH and the second drive line LL and the output end 35 of the negative amplifier 32n has a one-comb amplifier configuration.

Referring to FIG. 3 again, the voltage comparison circuit 34 is composed of a comparator CMP. The first input terminal (indicated by in in the figure) of the comparator CMP is connected to the node fbe. Further, the second input terminal (indicated by Ref in the figure) of the comparator CMP is connected to the node n0 which is the connection node between the output unit of the negative decoder 31n and the non-inverting input terminal of the negative amplifier 32n. The comparator CMP outputs a comparison result signal CRS which has a signal level of a logic level of 1 (that is, H level) when the voltage of the node fbe is larger than the voltage of the node n0 and has a signal level of a logic level of 0 (that is, L level) when the voltage of the node fbe is smaller than the voltage of the node n0.

The voltage comparison circuit 34 is a circuit provided to determine whether the source line SLA and the source line SLB which are adjacent channels are short-circuited. The comparison result signal CRS output from the voltage comparison circuit 34 is output from the source driver 14 and is supplied to a short-circuit determination unit (not shown) provided in the timing controller 12.

The voltage comparison operation of the voltage comparison circuit 34 will be described with reference to FIG. 5. Additionally, here, a case in which the positive electrode side input voltage inp is 15V and the negative electrode side input voltage inn is 1V will be described as an example.

When the source line SLA and the source line SLB are short-circuited at the far end (that is, the end portion far from the source driver 14), a short-circuit current flows in a direction indicated by a dashed arrow in the figure from the positive amplifier 32p toward the negative amplifier 32n. The current value of the short-circuit current is controlled by the drive capability of the negative amplifier 32n. As described above, since the drive capability of the negative amplifier 32n is reduced to $\frac{1}{10}$, the current value of the short-circuit current Ishort is 1 mA. When the resistance values of the resistor R10 and the resistor R20 are 0.2 kΩ and the source line loads of the source lines SLA and SLB are 5 kΩ, a relationship of "1 mA=(15V−fbe)÷(0.4 kΩ+10 kΩ)" is obtained and the voltage of the node fbe is obtained as fbe≈5V.

In this way, when the source line SLA and the source line SLB are short-circuited, the voltage value of the node fbe becomes 5V and becomes larger than the voltage value of 1V of the negative electrode side input voltage inn. Thus, the comparison result signal CRS having a logic level of 1 is output from the comparator CMP.

On the other hand, when the source line SLA and the source line SLB are not short-circuited, the voltage of the node fbe becomes the voltage value of 1V which is the same as that of the negative electrode side input voltage inn and the comparison result signal CRS having a logic level of 0 is output from the comparator CMP.

The comparison result signal CRS is supplied to a short-circuit determination unit (not shown) provided in the timing controller 12. The short-circuit determination unit determines that the short-circuit occurs between the source lines when the comparison result signal CRS having a logic level of 1 is received and determines that the short-circuit does not occur between the source lines when the comparison result signal CRS having a logic level of 0 is received.

Additionally, in this embodiment, in order to detect the occurrence of the short-circuit even when the short-circuit current occurring between the source lines SLA and SLB is small, the power-down signal PDS is supplied to reduce the drive capability of the negative amplifier 32n. Originally, the negative amplifier 32n has a high drive capability in order to drive the panel load (source line load) of the display panel 11. Thus, if the drive capability of the negative amplifier 32n is not reduced, the current load can be driven even when the short-circuit occurs. Thus, the voltage of the node fbe is not reduced and the short-circuit may not be detected. Here, in this embodiment, the output current of the negative amplifier 32 is reduced by decreasing the number of stages (combs) of the amplifiers constituting the negative amplifier 32 and the drive capability is reduced.

Figure 5:
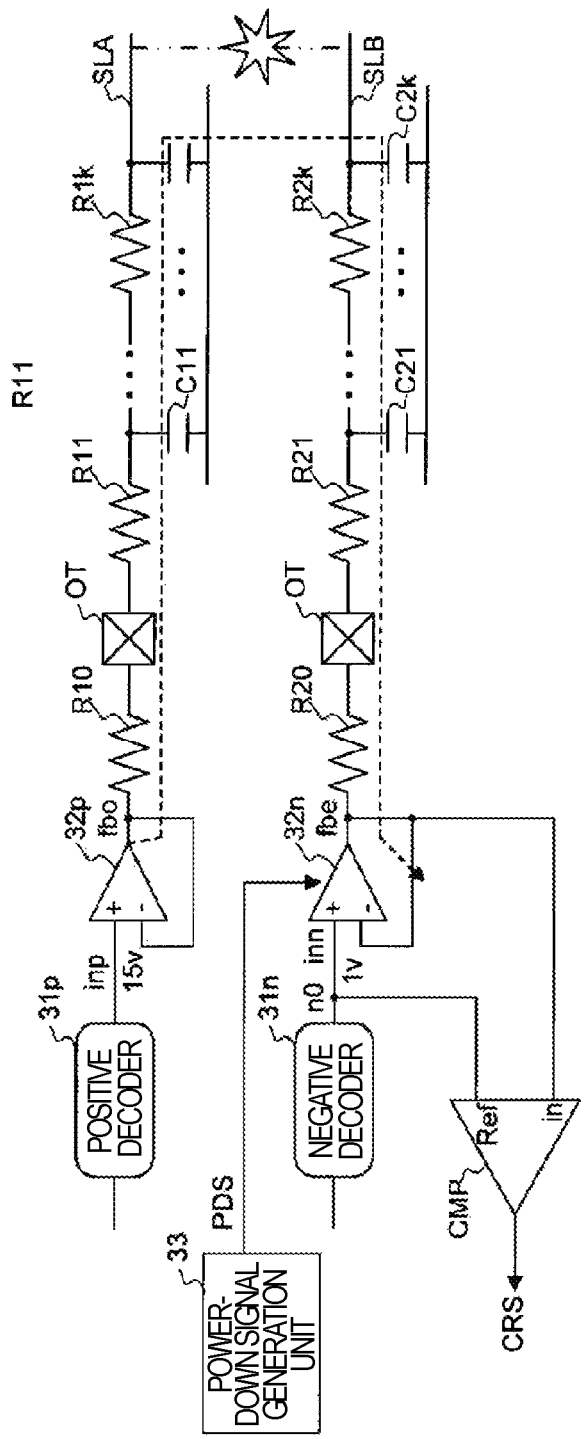
FIG. 5 is a diagram schematically showing a state of a current flowing through a source line when a short-circuit occurs.

Additionally, FIGS. 3 and 5 show a configuration in which the nodes located in the input unit and the output unit of the negative amplifier 32n are respectively connected to a pair of input terminals of the comparator CMP and the voltage is compared with the negative voltage. However, unlike this, the nodes located at the input unit and the output unit of the positive amplifier 32p may be connected to a pair of input terminals of the comparator CMP and the voltage may be compared with the positive voltage to detect the occurrence of the short-circuit.

Further, in the source driver 14 of this embodiment, the voltage comparison circuit 34 is not provided for each of a pair of source lines (hereinafter, referred to as a source line pair) constituting the adjacent channels, but one voltage comparison circuit is configured to be able to detect the occurrence of the short-circuit for twenty four channels by switching the source line which is a voltage comparison target by time division.

Figure 6:
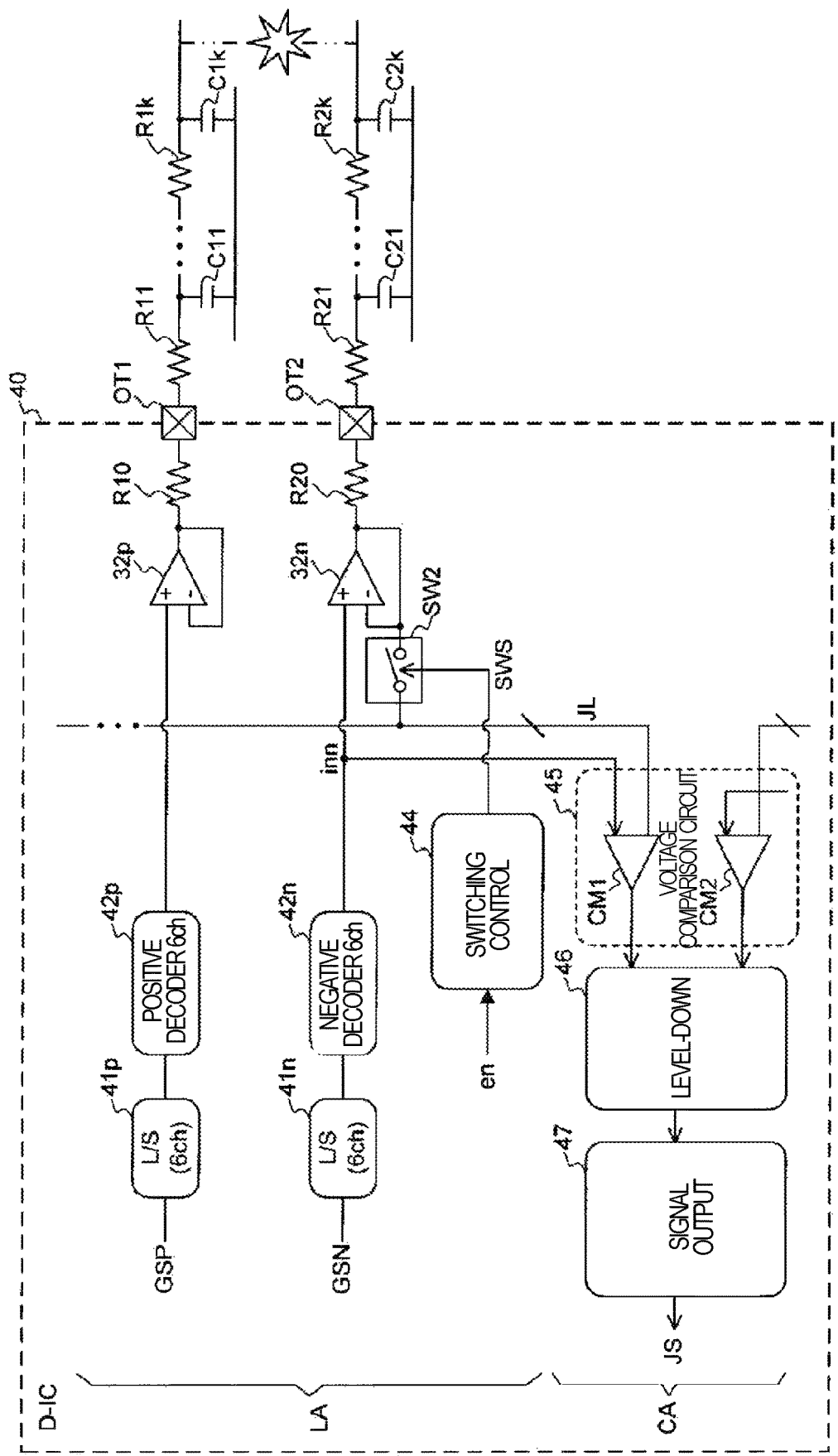
FIG. 6 is a diagram showing an image of an entire chip of the source driver of the first embodiment.

FIG. 6 is a diagram showing an image of an entire chip of the source driver 14. A voltage comparison circuit 45 is configured to be able to compare the voltage while changing the target source line in time division increments of twenty four channels according to the switching control by a switching control circuit 44. Additionally, here, the power-down signal generation unit 33 is not shown.

An L/S circuit 41p is a latch circuit which captures the pixel data piece PD (indicated by GSP in the figure) for six channels on the positive electrode side. A positive decoder 42p is a positive electrode side decoder which generates a gradation voltage for six channels on the positive electrode side on the basis of the pixel data piece output from the L/S circuit 41p. The positive electrode side gradation voltage output from the positive decoder 42p is input to the non-inverting input terminal of the positive amplifier 32p.

An L/S circuit 41n is a latch circuit which captures the pixel data pieces PD (indicated by GSN in the figure) for six channels on the negative electrode side. A negative decoder 42n is a negative electrode side decoder which generates a gradation voltage for six channels on the negative electrode side on the basis of the pixel data piece output from the L/S circuit 41n. The negative electrode side gradation voltage output from the negative decoder 42n is input to the non-inverting input terminal of the negative amplifier 32n.

The switching control circuit 44 receives an enable signal en indicating the start of the execution of the voltage comparison process and switches a switch SW2.

The switch SW2 is provided between the output terminal and the inverting input terminal and the negative amplifier 32n and the detection line JL. When the switch SW2 is turned on, the output terminal of the negative amplifier 32n is connected to an input terminal of a comparator CM1 of the inverting input terminal.

Additionally, FIG. 6 shows the positive amplifier 32p and the negative amplifier 32n corresponding to the source lines for two channels and the switch SW2, but in fact, six similar configurations are provided for twelve channels. The switching control circuit 44 switches the switch SW2 in a time division manner. As a result, the source lines which are voltage comparison targets are sequentially switched and finally the voltage comparison is performed on the source lines for twelve channels, so that the presence or absence of the short-circuit with the adjacent channel is detected.

The L/S circuit 41p, the L/S circuit 41n, the positive decoder 42p, the negative decoder 42n, and the switching control circuit 44 are provided on the left side region (hereinafter, referred to as a chip left side region LA) of the chip constituting the source driver 14. Additionally, the right side region (not shown) of the chip is provided with a configuration similar to these.

A chip center region CA located between the chip left side region LA and the chip right side region is provided with the voltage comparison circuit 45, a level-down circuit 46, and a signal output circuit 47.

The voltage comparison circuit 45 includes the comparator CM1 which compares the voltage in the source lines for twelve channels (six channels on the positive electrode side and six channels on the negative electrode side) in the chip left side region LA and a comparator CM2 which compares the voltage in the source lines for twelve channels in the right side region.

The first input terminal of the comparator CM1 is connected to the detection line JL. Further, the second input terminal of the comparator CM1 is connected to the connection node (that is, the negative electrode side input voltage inn) between the output unit of the negative decoder 42n and the non-inverting input terminal of the negative amplifier 32. The comparator CM1 outputs a comparison result signal having a signal level of a logic level of 1 (that is, H level) when the voltage of the detection line JL is larger than the voltage of the negative electrode side input voltage inn and outputs a comparison result signal having a signal level of a logic level of 0 (that is, L level) when the voltage of the detection line JL is equal to or smaller than the negative electrode side input voltage inn. Additionally, since the right side region of the comparator CM2 also has the same configuration and performs the same operation, the description is omitted here.

The level-down circuit 46 level-downs and outputs the comparison result signals output from the comparators CM1 and CM2. The output circuit 47 outputs the level-down comparison result signal as the determination signal JS.

As described above, the source driver 14 of this embodiment compares the voltage (that is, the negative electrode side input voltage inn) of the node n0 connected to the input terminal of the negative amplifier 32n with the voltage of the node fbe connected to the output terminal of the negative amplifier 32n. Accordingly, it is determined whether or not the short-circuit occurs between the source line SLA and the source line SLB which are adjacent to each other. When it is determined that the short-circuit occurs between the source lines SLA and SLB, the voltage of the node fbe becomes larger than the voltage of the node n0 due to the voltage drop (actually, the voltage rise because the voltage drop is on the negative electrode side) caused when the short-circuit current flows through the source lines SLA and SLB. Thus, it is determined that the short-circuit occurs if the voltage of the node fbe is larger than the voltage of the node n0 as the voltage comparison result and it is determined that the short-circuit does not occur if the voltage of the node fbe is not larger than the voltage of the node n0.

According to such a configuration, since the voltage comparison circuit is provided in the IC chip constituting the source driver 14, it is possible to detect the occurrence of the short-circuit between the adjacent channels of the source line with a simple configuration.

Further, since it is possible to detect the occurrence of the short-circuit of the entire chip by switching the source line as the voltage comparison target in time division, the time and effort required for inspection is small and the occurrence of the short-circuit can be detected quickly.

Second Embodiment

Next, a second embodiment of the disclosure will be described. A display device of the second embodiment is different from the display device of the first embodiment in the configuration of an output unit including a voltage comparison circuit in a source driver.

Figure 7:
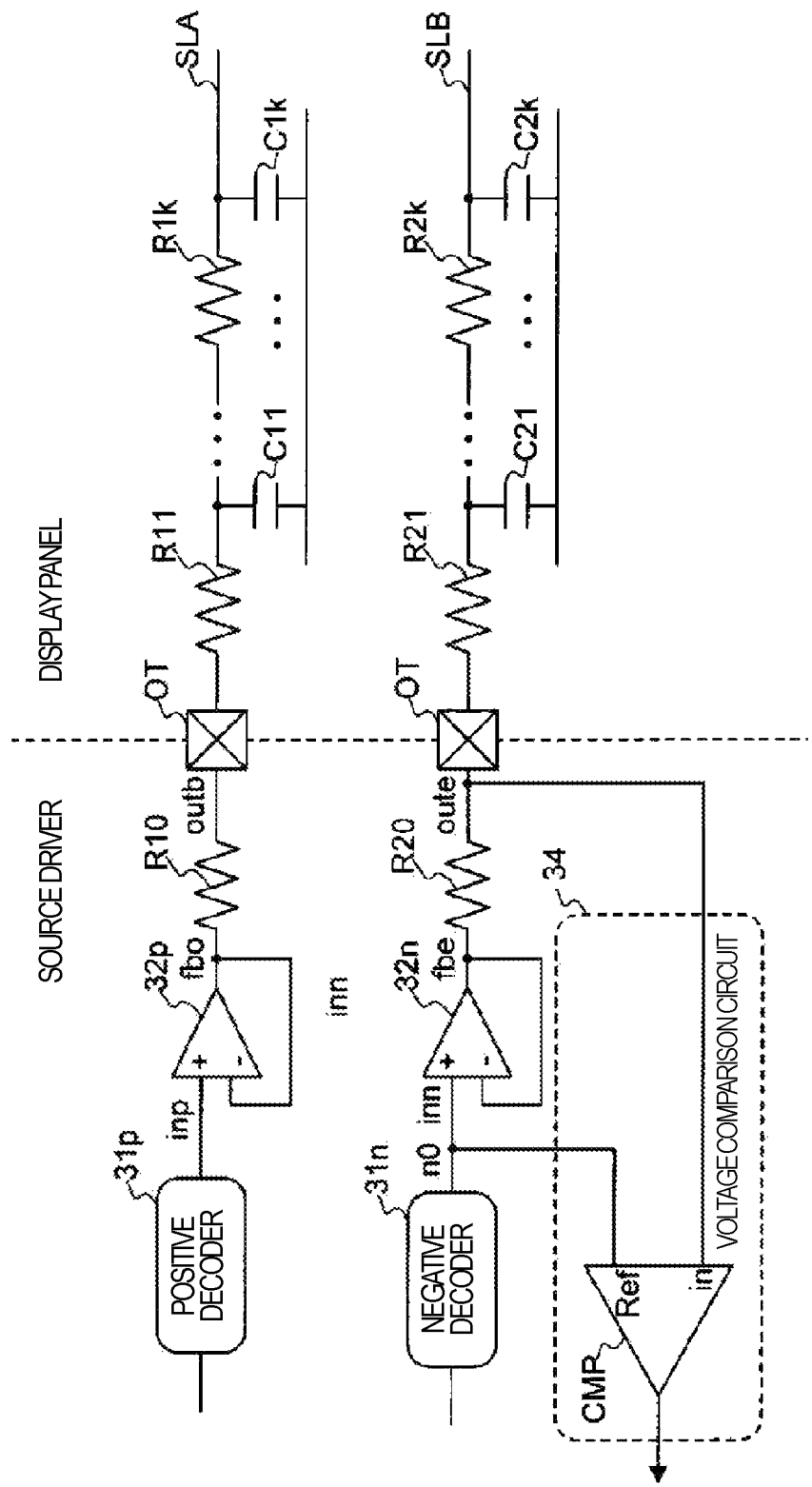
FIG. 7 is a circuit diagram showing a part of an internal configuration of a source driver of a second embodiment.

FIG. 7 is a circuit diagram showing a part of the configuration of the gradation voltage conversion unit 22 and the output unit 23 of the source driver 14 of this embodiment.

The first input terminal (indicated by in in the figure) of the comparator CMP constituting the voltage comparison circuit 34 is connected to the node oute which is the connection node between the other end of the resistor R20 and the source output terminal OT2. Further, the second input terminal (indicated by Ref in the figure) of the comparator CMP is connected to the node n0 which is the connection node between the output unit of the negative decoder 31n and the non-inverting input terminal of the negative amplifier 32n.

The comparator CMP outputs a comparison result signal CRS which has a signal level of a logic level of 1 (that is, H level) when the voltage of the node oute is larger than the voltage of the node n0 and has a signal level of a logic level of 0 (that is, L level) when the voltage of the node oute is smaller than the voltage of the node n0.

The source driver 14 of this embodiment does not include the power-down signal generation unit PDS as in the first embodiment and does not supply the power-down signal PDS to the negative amplifier 32n. Thus, the drive capability of the negative amplifier 32n is the same as that in the normal operation.

Figure 8:
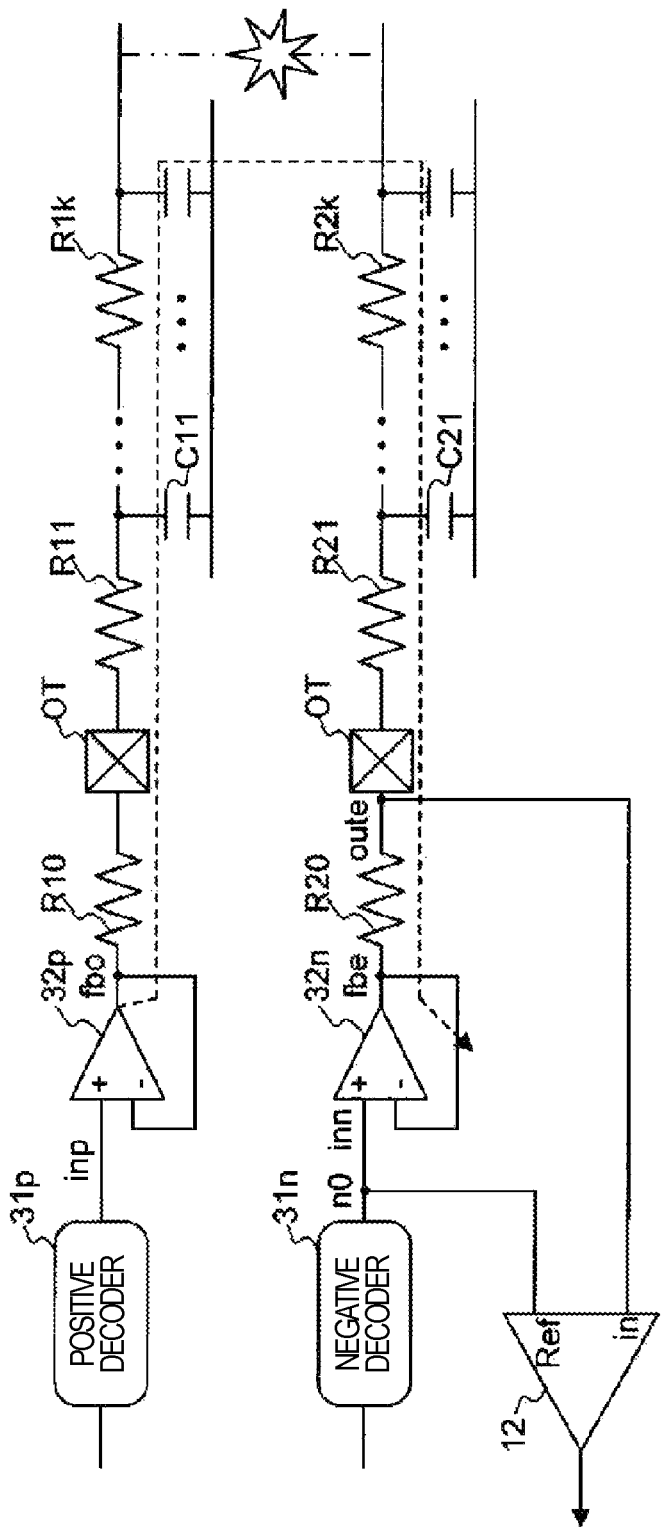
FIG. 8 is a diagram schematically showing a state of a current flowing through a source line when a short-circuit occurs.

FIG. 8 is a diagram schematically showing a short-circuit current flowing when the short-circuit occurs in the source line SLA and SLB. When the source line SLA and the source line SLB are short-circuited at the far end, the short-circuit current flows as indicated by a dashed arrow in the figure from the positive amplifier 32p toward the negative amplifier 32n. As described above, since the drive capability of the negative amplifier 32n is not reduced in this embodiment, the voltage of the node fbe also becomes 1V when the voltage of the node n0 is set to 1V. Since the voltage of the node oute drops from the voltage of the node fbe by the voltage drop in the resistor R20, a relationship of "oute=1V+ (R20×Ishort)=1V+Vdrop" is obtained. Thus, when the short-circuit occurs, the voltage of the node oute becomes larger than the voltage of the node fbe.

In this way, when the source line SLA and the source line SLB are short-circuited, the voltage of the node oute becomes larger than the voltage of the node fbe. Thus, the comparison result signal CRS having a logic level of 1 is output from the comparator CMP.

On the other hand, when the source line SLA and the source line SLB are not short-circuited, the voltage of the node oute has the same voltage value as that of the voltage of the node fbe and the comparison result signal CRS having a logic level of 0 is output from the comparator CMP.

Figure 9:
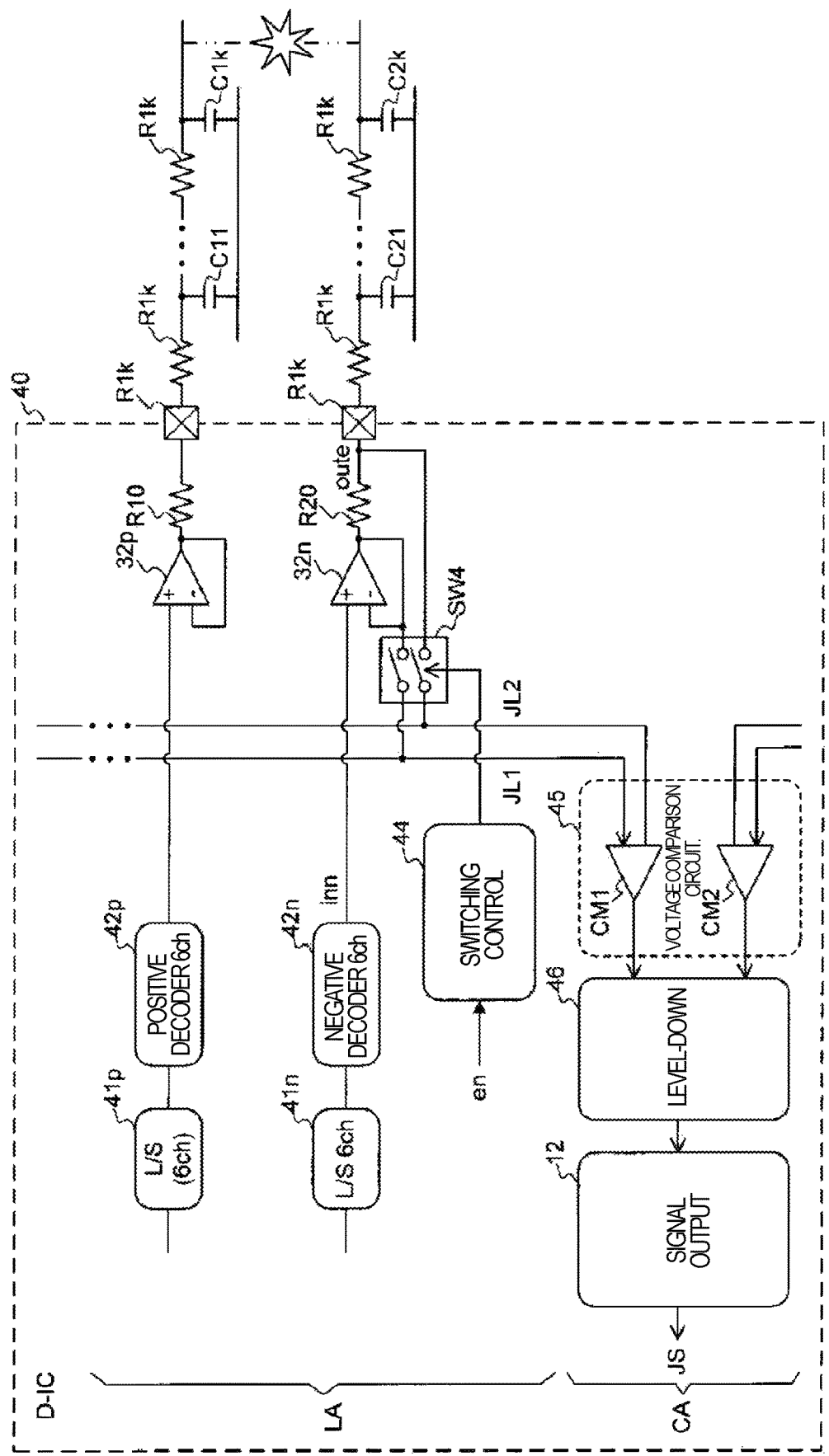
FIG. 9 is a diagram showing an image of an entire chip of the source driver of the second embodiment.

FIG. 9 is a diagram showing an image of an entire chip of the source driver 14 of this embodiment.

The switching control circuit 44 receives an enable signal en indicating the start of the execution of the voltage comparison process and switches a switch SW4.

The switch SW4 switches the connection and non-connection between the output terminal and the inverting input terminal of the negative amplifier 32n and the first detection line JL1. Further, the switch SW4 switches the connection and non-connection between the second detection line JL2 and the node oute which is the connection node between the other end of the resistor R20 and the output terminal OT2. When the switch SW4 is turned on and these are in the "connection" state, the output terminal and the inverting input terminal of the negative amplifier 32n are connected to one of the input terminal of comparator CM1 via the first detection line JL1 and the node oute is connected to the other of the input terminal of the comparator CM1 via the second detection line JL2.

The comparator CM1 outputs a comparison result signal having a logic level of 1 (that is, H level) when the voltage of the second detection line JL2 is larger than the voltage of the first detection line JL1. Further, the comparator CM1 outputs a comparison result signal having a logic level of 0 (that is, L level) when the voltage of the second detection line JL2 is equal to or smaller than the voltage of the first detection line JL1.

As described above, the source driver 14 of this embodiment compares the voltage of the node fbe connected to the output terminal of the negative amplifier 32n with the voltage of the node oute connected to the source output terminal OT2. Accordingly, it is determined whether or not the short-circuit occurs between the source line SLA and the source line SLB which are adjacent to each other. When the short-circuit occurs between the source lines SLA and SLB, the voltage of the node oute drops by the amount of the voltage drop in the resistor R20 (actually, the voltage rises because the voltage drop is on the negative electrode side) as the short-circuit current flows through the source lines SLA and SLB. Thus, it is determined that the short-circuit concurs if the voltage of the node oute is larger than the voltage of the node fbe and it is determined that the short-circuit does not occur if the voltage of the node oute is not larger than the voltage of the node fbe.

According to such a configuration, it is possible to detect the occurrence of the short-circuit between the adjacent channels of the source line with a simple configuration in which the voltage comparison circuit is provided in the IC chip as in the first embodiment. Further, since it is not necessary to provide the power-down signal generation unit 33 unlike the first embodiment, it is possible to detect the occurrence of the short-circuit with a simpler configuration than that of the first embodiment.

Further, in the first embodiment, since the drive capability of the negative amplifier 32n is reduced, it is necessary to detect the short-circuit by comparing the voltage during a blank period in which pixel data is not supplied. However, in this embodiment, since the drive capability of the negative amplifier 32n is not reduced, it is possible to detect the short-circuit by performing voltage comparison while actually generating and supplying the gradation voltage signal based on pixel data.

Third Embodiment

Next, a third embodiment of the disclosure will be described. A display device of the third embodiment is different from the display devices of the first embodiment and the second embodiment in that a configuration for displaying a detection result of the occurrence of a short-circuit between adjacent channels of a source line on a display panel is provided.

Figure 10:
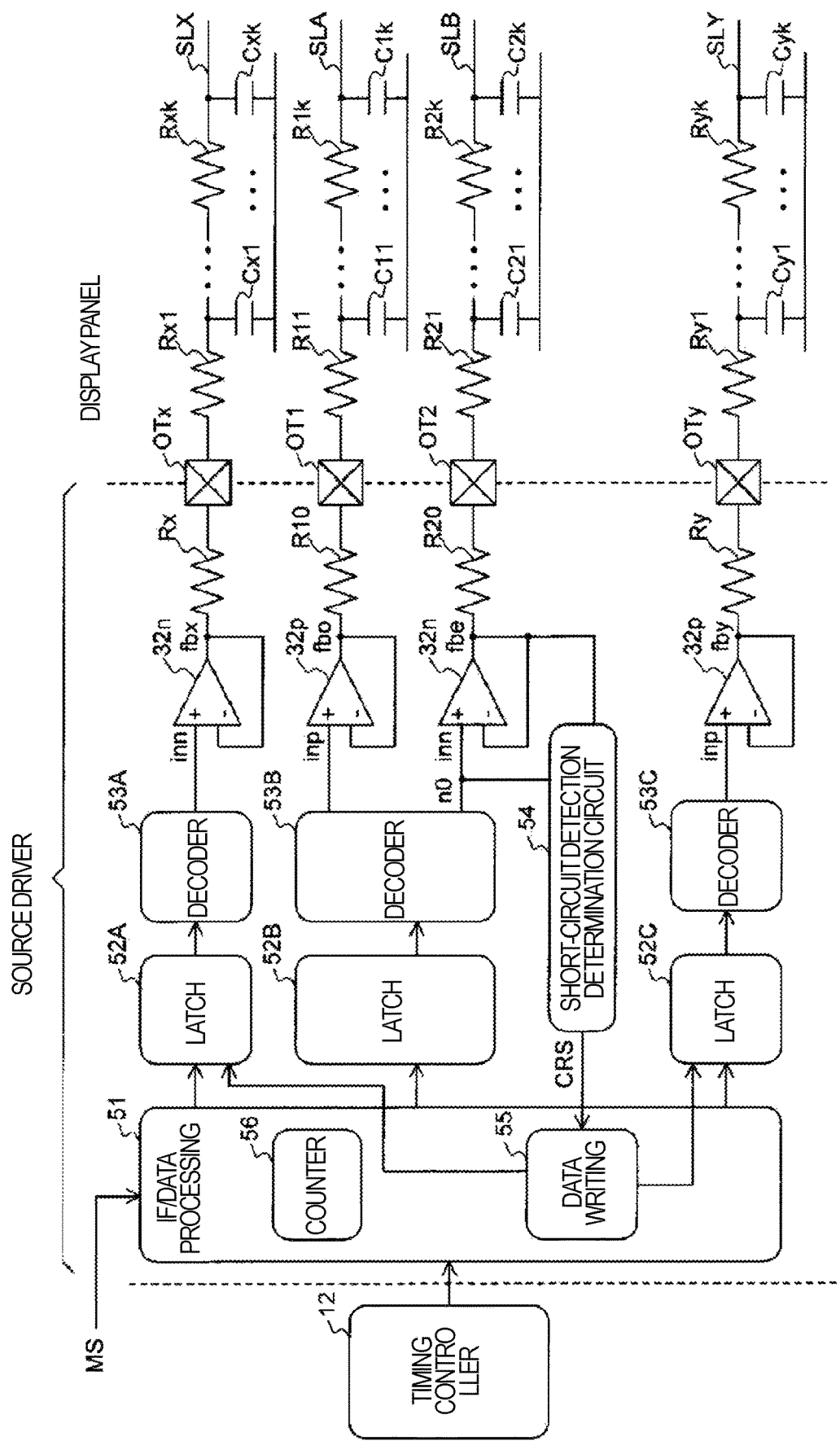
FIG. 10 is a circuit diagram showing a part of an internal configuration of a source driver of a third embodiment.

FIG. 10 is a circuit diagram showing a part of the configuration of the source driver of this embodiment. The source driver of this embodiment includes an IF/data processing circuit 51, latch circuits 52A, 52B and 52C, decoders 53A, 53B and 53C, a short-circuit detection determination circuit 54, a data writing circuit 55, and a counter 56. The data writing circuit 55 and the counter 56 are provided in the IF/data processing circuit 51. Additionally, the source driver of this embodiment includes the same power-down signal generation circuit as that of the first embodiment, but the circuit is not shown in FIG. 10.

The IF/data processing circuit 51 is an interface circuit which receives the video data signal VDS and the frame synchronization signal FS transmitted from the timing controller 12. Further, the IF/data processing circuit 51 performs various data processes on the basis of the video data signal VDS and the frame synchronization signal FS. For example, the IF/data processing circuit 51 includes a serial-parallel conversion circuit (not shown), converts a series of pixel data pieces PD included in the video data signal VDS into parallel data, and supplies the parallel data to the latch circuits 52A, 52B, and 52C.

Further, the IF/data processing circuit 51 receives a mode switching signal MS from the outside of the source driver and switches the operation mode to either the normal operation mode or the short-circuit detection mode. In the normal operation mode, an operation for performing a display based on the video data signal VDS from the timing controller 12, that is, an operation of supplying the pixel data piece PD acquired from the video data signal VDS to the latch circuits 52A, 52B and 52C is performed.

On the other hand, in the short-circuit detection mode, the IF/data processing circuit 51 supplies the pixel data pieces for displaying black on the entire screen of the display panel 11 to the latch circuits 52A, 52B, and 52C.

The latch circuits 52A, 52B and 52C capture the pixel data pieces PD output from the IF/data processing circuit 51 and supply the captured pixel data pieces PD to the decoders 53A, 53B and 53C as the pixel data Q.

The decoders 53A, 53B and 53C generate a gradation voltage on the basis of the pixel data Q and supplies the gradation voltage to the positive amplifier 32p and the negative amplifier 32n. In FIG. 10, a gradation voltage supplied to the positive amplifier 32p is indicated by inp and a gradation voltage supplied to the negative amplifier 32n is indicated by inn.

The short-circuit detection determination circuit 54 is a circuit for determining whether or not the source line SLA and the source line SLB which are adjacent channels are short-circuited. The short-circuit detection determination circuit 54 is composed of a comparator (not shown) which compares the voltage of the node n0 with the voltage of the node fbe similarly to the voltage comparison circuit 34 of the first embodiment.

The short-circuit detection determination circuit 54 outputs a comparison result signal CRS which has a signal level of a logic level 1 (H level) when the voltage of the node fbe is larger than the voltage of the node n0 and has a signal level of a logic level 0 (L level) when the voltage of the node fbe is equal to or smaller than the voltage of the node n0.

When the source line SLA and the source line SLB are short-circuited similarly to the first embodiment, a short-circuit current flows from the positive amplifier 32p toward the negative amplifier 32n. Since the drive capability of the negative amplifier 32n is reduced to about 1/10 by a power-down signal (not shown), the voltage of the node fbEe becomes about 5V, for example, when the positive electrode side input voltage inp is 15V, the negative electrode side input voltage inn is 1V, each of the resistance values of the resistor R10 and the resistor R20 is 0.2 kΩ, and each of the source line loads of the source lines SLA and SLB is 5 kΩ. Thus, the comparison result signal CRS having a logic level of 1 is output from the short-circuit detection determination circuit 54.

On the other hand, when the source line SLA and the source line SLB are not short-circuited, the voltage of the node fbe has the same voltage value of 1V as the negative electrode side input voltage inn and the comparison result signal CRS having a logic level of 0 is output from the comparator CMP.

The short-circuit detection determination circuit 54 of this embodiment is different from the voltage comparison circuit of the first embodiment and supplies the comparison result signal CRS to the data writing circuit 55 in the IF/data processing circuit 51.

The data writing circuit 55 is a circuit which receives the comparison result signal CRS and writes data to a source line pair adjacent to the outside of the source lines SLA and SLB, that is, a source line SLX which is an adjacent source line located on the side opposite to the source line SLB when viewed from the source line SLA and a source line SLY which is an adjacent source line located on the side opposite to the source line SLA when viewed from the source line SLB.

As described above, when the mode is switched to the short-circuit detection mode, the pixel data piece for displaying black (pixel value 0) is supplied from the IF/data processing circuit 51 to the latch circuits 52A, 52B and 52C. In response to this, the gradation voltage for displaying black is output from the source driver, and the black screen is displayed on the display panel 11.

In this state, when the comparison result signal CRS having a logic level of 1 is supplied from the short-circuit detection determination circuit 54 to the data writing circuit 55, the data writing circuit 55 supplies the pixel data piece for displaying white (pixel value of 255) to the latch circuit 52A corresponding to the source line SLX and the latch circuit 52C corresponding to the source line SLY. In response to this, the gradation voltage for displaying white is output from the source driver and a white screen is displayed at a position corresponding to the source lines SLX and SLY of the display panel 11.

On the other hand, when the comparison result signal CRS having a logic level of 0 is supplied from the short-circuit detection determination circuit 54 to the data writing circuit 55, the data writing circuit 55 does not supply the pixel data piece to the latch circuit 52A and 52C and the black screen is continuously displayed on the display panel 11.

The counter 56 is a circuit that generates a count value indicating the source line pair which is the short-circuit detection target of the short-circuit detection determination circuit 54. FIG. 10 shows a configuration in which the short-circuit detection for only a pair of the source lines SLA and SLB is performed, but when the short-circuit detection of the entire chip is performed as described below, the source line pair of the detection target is sequentially switched. At that time, since the count value of the counter 56 indicates the source line pair which is the short-circuit detection target, the data writing circuit 55 can perform an operation of writing white to the source line adjacent to the source line pair of the detection target. The counter 56 generates a count value by counting based on a clock signal included in the video data signal VDS, for example, triggered by the supply of the mode switching signal MS to the IF/data processing circuit 51.

Figure 11:
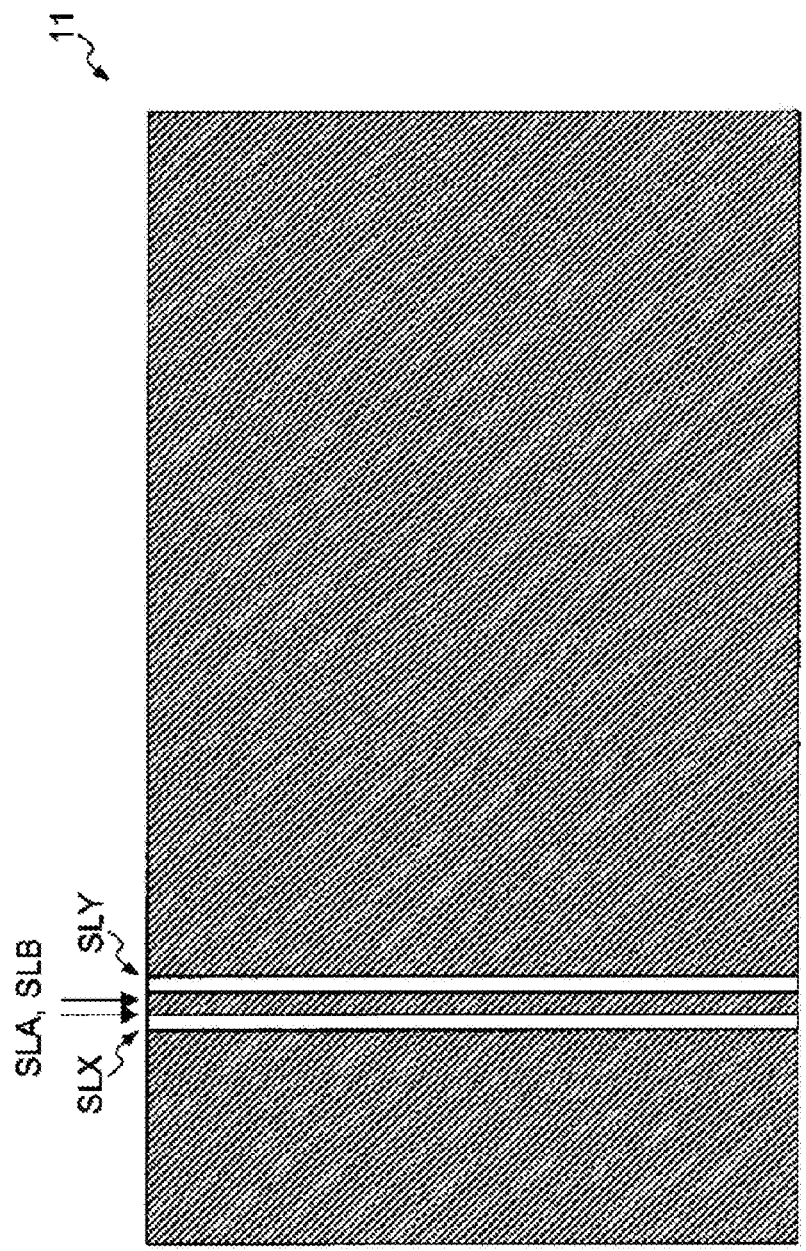
FIG. 11 is a diagram showing an image of a short-circuit detection screen displayed on a display panel.

FIG. 11 is a diagram showing an example of a short-circuit detection screen displayed on the display panel when the short-circuit of the source line SLA and the source line SLB is detected.

Since it is the short-circuit detection mode, the entire display panel 11 is displayed in black. Then, in order to show the detection of the short-circuit of the source line SLA and SLB, the positions corresponding to the source lines SLX and SLY adjacent to the outside to sandwich the source lines SLA and SLB are displayed in white.

Figure 12:
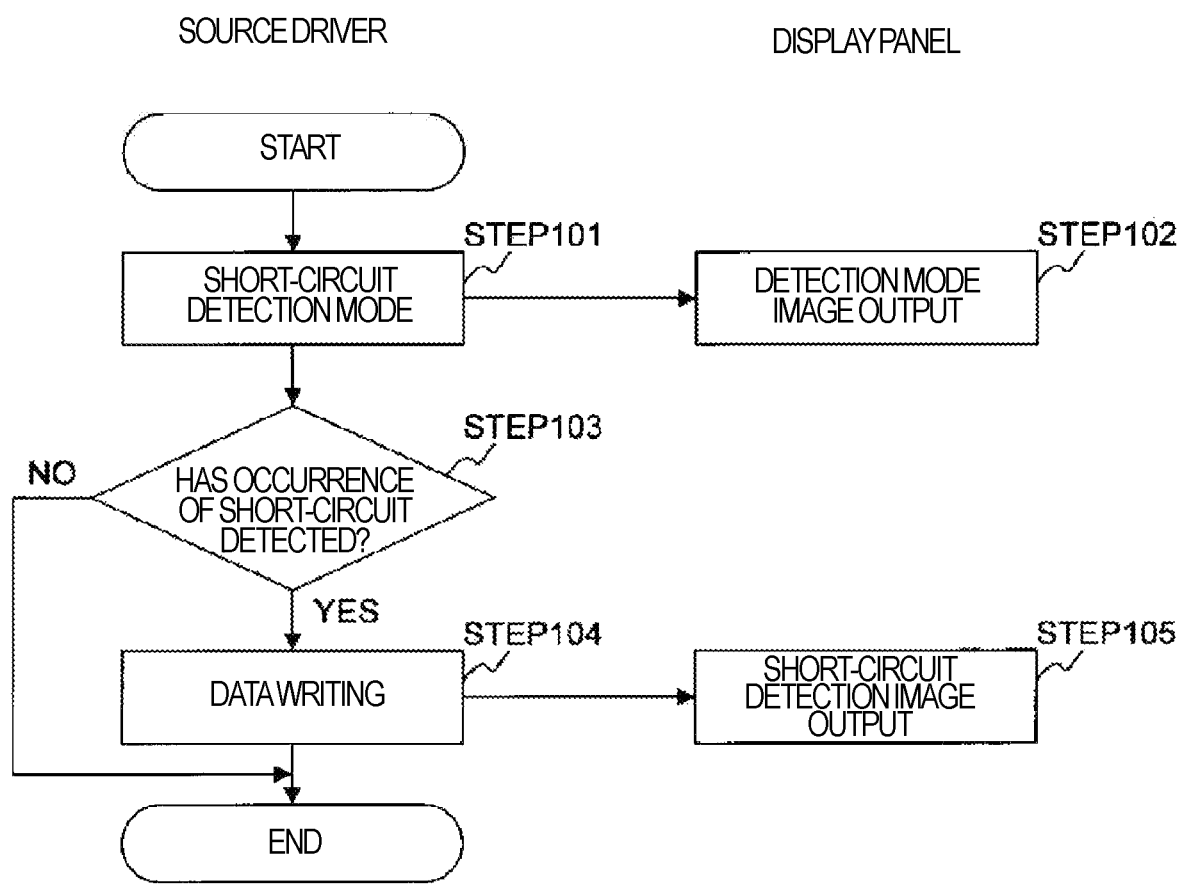
FIG. 12 is a flowchart showing a processing routine of a defect detection operation of the third embodiment.

Next, a process operation of the short-circuit detection process executed by the source driver of this embodiment will be described with reference to the flowchart of FIG. 12.

The IF/data processing circuit 51 receives the mode switching signal MS requiring the switching to the short-circuit detection mode and switches the operation to the short-circuit detection mode (STEP 101).

The IF/data processing circuit 51 supplies the pixel data piece PD (in this embodiment, the pixel data piece PD corresponding to black) for the short-circuit detection mode to each latch circuit. The gradation voltage is generated and amplified and is applied to the source line to display a detection mode image (in this embodiment, a black screen) on the display panel 11 (STEP 102).

The short-circuit detection determination circuit 54 detects the presence or absence of the short-circuit in the source lines SLA and SLB and supplies the comparison result signal CRS representing the detection result to the data writing circuit 55 of the IF/data processing circuit 51. The data writing circuit 55 determines whether the short-circuit is detected on the basis of the comparison result signal CRS (STEP 103).

When it is determined that the short-circuit is detected (STEP 103: YES), the data writing circuit 55 supplies the pixel data piece PD for displaying a short-circuit occurrence detection image (in this embodiment, a white image) at a position on the display screen to the latch circuit corresponding to the source lines SLX and SLY which are the source lines adjacent to the source lines SLA and SLB in which the occurrence of the short-circuit is detected. The gradation voltage is generated and amplified and is applied to the source line to display a short-circuit detection image indicating the detection of the occurrence of the short-circuit on the display panel 11 (in this embodiment, a white display at the source line position adjacent to the short-circuited source line) (STEP 104).

On the other hand, when it is determined that the occurrence of the short-circuit is not detected (STEP 103: NO), the short-circuit detection process is ended.

Additionally, in the source driver of this embodiment, one short-circuit detection determination circuit is provided at the center portion of the chip similarly to the source driver of the first embodiment and the occurrence of the short-circuit in the source line for twenty four channels can be detected by switching the source line as the short-circuit detection target in time division.

Figure 13:
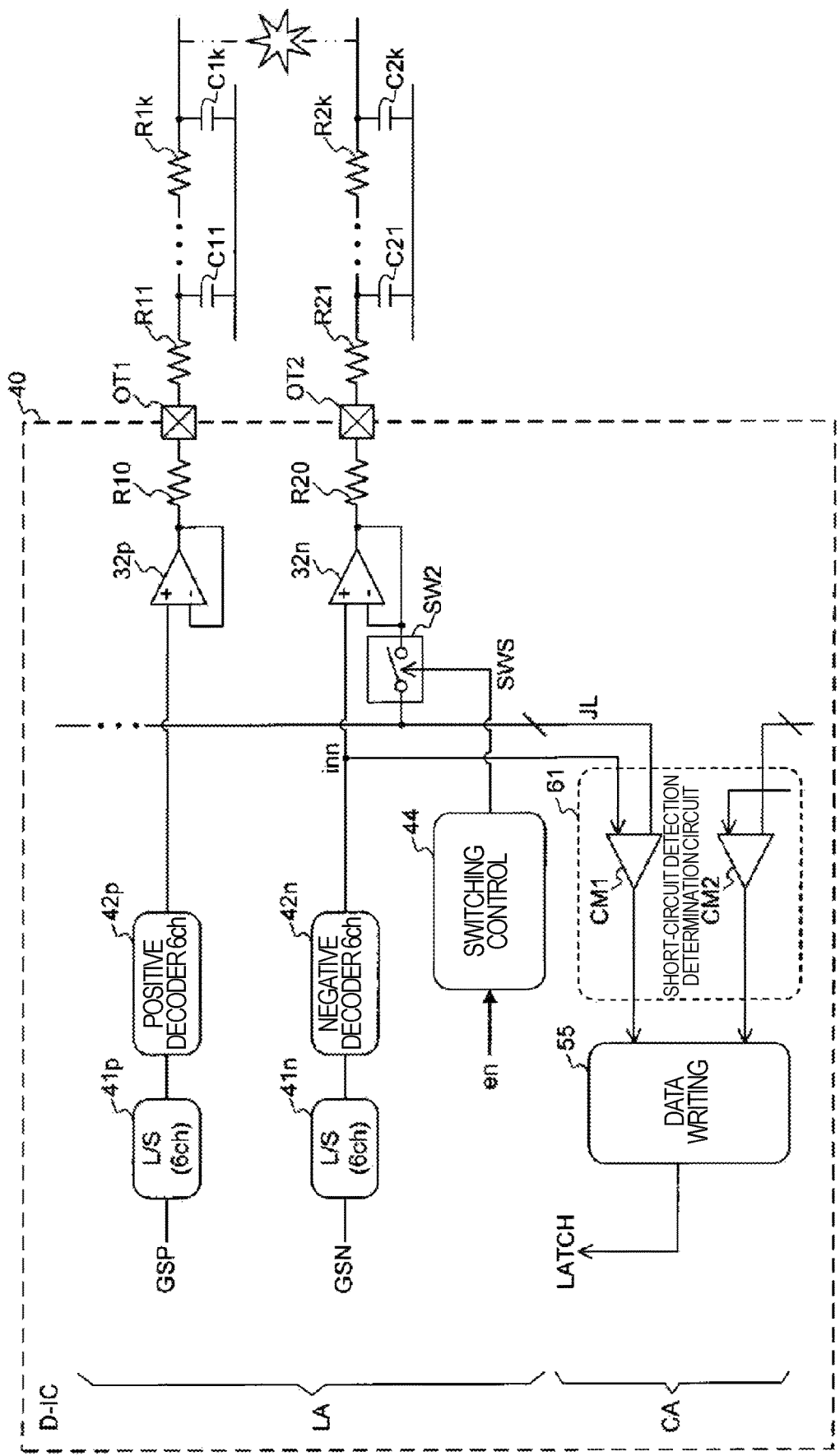
FIG. 13 is a diagram showing an image of an entire chip of the source driver of the third embodiment.

FIG. 13 is a diagram showing an image of the entire source driver of this embodiment. A short-circuit detection determination circuit 61 performs a short-circuit detection while changing the target source line in time division increments of twenty four channels according to the switching control by the switching control circuit 44.

The switching control circuit 44 receives an enable signal en indicating the start of the execution of the short-circuit detection process and sequentially switches the switch SW2 in response to this. The switch SW2 is provided between the output terminal and the inverting input terminal of the negative amplifier 32n and the detection line JL. When the switch SW2 is turned on, the output terminal and the inverting input terminal of the negative amplifier 32n are connected to the input terminal of the comparator CM1 in the short-circuit detection determination circuit 61.

The short-circuit detection determination circuit 61 includes the comparator CM1 which compares the voltage in the source lines for twelve channels (six channels on the positive electrode side and six channels on the negative electrode side) in the first region that is responsible for half of the chip constituting the source driver and the comparator CM2 which compares the voltage in the source lines for twelve channels in the second region that is responsible for the other half of the chip.

The first input terminal of the comparator CM1 is connected to the detection line JL. Further, the second input terminal of the comparator CM1 is connected to the connection node (that is, the negative electrode side input voltage inn) between the output unit of the negative decoder 42n and the non-inverting input terminal of the negative amplifier 32. The comparator CM1 outputs a comparison result signal CRS which has a signal level of a logic level of 1 (that is, H level) when the voltage of the detection line JL is larger than the voltage of the negative electrode side input voltage inn and has a signal level of a logic level of 0 (that is, L level) when the voltage of the detection line JL is equal to or smaller than the negative electrode side input voltage inn. Additionally, the comparator CM2 also has the same configuration in the second region of the chip and performs the same operation.

The comparators CM1 and CM2 supply the comparison result signal CRS to the data writing circuit 55. The data writing circuit 55 supplies the pixel data piece PD (in this embodiment, the pixel data piece corresponding to white) for displaying the short-circuit detection image to the latch circuit corresponding to the source line adjacent to the source line in which the occurrence of the short-circuit is detected (that is, the comparison result signal CRS has a logic level of 1) on the basis of the comparison result signal CRS.

Additionally, as shown in FIG. 2, the IF/data processing circuit 51 is provided with the counter 56 which counts based on a clock signal and generates a count value. Since the target source line is switched by the short-circuit detection determination circuit 61 in synchronization with the clock signal, it is possible to determine the source line which is currently detected by the short-circuit detection determination circuit 61 on the basis of the count value generated by the counter 56. The data writing circuit 55 supplies the pixel data piece PD for the short-circuit detection image to the latch circuit connected to the corresponding source line on the basis of the count value generated by the counter 56.

As described above, in the source driver of this embodiment, the occurrence of the short-circuit in the adjacent source line pair is detected and the result is displayed on the display panel. Specifically, in the short-circuit detection mode, the entire screen is displayed in black and when the occurrence of the short-circuit is detected, the position adjacent to the occurrence position is displayed in white. According to such a display, the user can visually recognize that the short-circuit has occurred between any of the source lines.

Further, according to the source driver of this embodiment, since the position of the source line adjacent to the short-circuit occurrence position is displayed in white, the user can visually specify the short-circuit occurrence position in addition to the recognition of the occurrence of the short-circuit.

Further, according to the source driver of this embodiment, since the above-described process can be performed regardless of the operation of the timing controller 12, it is possible to display the short-circuit detection result on the display panel 11 without mounting a special configuration on the timing controller 12.

Additionally, the disclosure is not limited to the above-described embodiment. For example, in the above-described embodiments, a case in which the plurality of source drivers 14-1 to 14-*p* are provided and the voltage comparison circuit as in the above-described embodiments is provided in each of them has been described as an example. However, unlike this, it is possible to apply the configuration of the above-described embodiments to a display device provided with only one source driver.

Further, in the above-described embodiments, a case in which the timing controller 12 includes the short-circuit determination unit (not shown) and determines the presence or absence of the short-circuit on the basis of the comparison result signal from the voltage comparison circuit has been described. However, the disclosure is not limited to this configuration and the short-circuit determination unit may be provided in another portion of the source driver 14 or the display device 100.

Further, in the above-described embodiments, an example of detecting the occurrence of the short-circuit by comparing the input/output voltages of the negative amplifier 32*n* has been described. However, unlike this, the configuration may be such that the occurrence of the short-circuit is detected by comparing the input/output voltages of the positive amplifier 32*p*.

Further, in the above-described embodiments, a case in which gradation voltages having different polarities are supplied to adjacent channels has been described as an example. However, it is possible to apply the configuration of the above-described embodiments even when the gradation voltage having the same polarity is supplied. For example, a potential difference may be provided between adjacent channels by using different data for the input data of the adjacent channels so that a current flows from one side to the other side when the short-circuit occurs. With this configuration, it is possible to detect the short-circuit by comparing the voltages.

Further, in the third embodiment, an example has been described in which the black screen is displayed on the display panel 11 as a detection mode screen and the source line position adjacent to the position in which the occurrence of the short-circuit is detected is displayed in white. However, the color selection and display method is not limited thereto. For example, a screen having a color other than black may be displayed on the display panel 11 as a detection mode screen. Further, when the occurrence of the short-circuit is detected, it may be configured to display a specific color other than white. Further, it may be configured to display a specific color at a position corresponding to another source line instead of the source line adjacent to the source line pair in which the occurrence of the short-circuit is detected.

Further, when the occurrence of the short-circuit is detected, a specific color may be displayed on the entire screen (that is, all source lines other than the position in which the short-circuit occurs). According to such a method, for example, when the user needs to be aware of the occurrence of the short-circuit, but does not need to specify the position of the short-circuit, it is possible to display that the short-circuit has occurred in a more understandable manner.

Further, in the third embodiment, a case in which the short-circuit detection determination circuit 54 supplies the comparison result signal CRS to the data writing circuit 55 has been described, but in addition to this configuration, the comparison result signal CRS may be also supplied to the timing controller 12. According to such a configuration, it is possible to perform the same short-circuit determination as the first embodiment in the timing controller 12 in addition to the display of the short-circuit detection result on the display panel 11.

Further, in the third embodiment, a case in which the occurrence of the short-circuit is detected by the same method as the first embodiment has been described as an example. However, unlike this, the occurrence of the short-circuit may be detected by the method of the second embodiment.

What is claimed is:

1. A source driver which is connected to a display panel including a plurality of source lines and a plurality of pixel units connected to the plurality of source lines, receives a video data signal including a series of pixel data pieces, and outputs a gradation voltage to be applied to the plurality of pixel units based on the video data signal, the source driver comprising:
   a first gradation voltage generation unit which generates a gradation voltage of a first polarity to be supplied to a pixel on a first source line of the plurality of source lines;
   a first amplifier which receives an input of the gradation voltage of the first polarity to an input end, amplifies the gradation voltage of the first polarity, and outputs a voltage from an output end;
   a second gradation voltage generation unit which generates a gradation voltage of a second polarity corresponding to a polarity opposite to the first polarity to be supplied to a pixel on a second source line corresponding to a source line provided in the vicinity of the first source line;
   a second amplifier which receives an input of the gradation voltage of the second polarity to an input end, amplifies the gradation voltage of the second polarity, and outputs a voltage from an output end; and
   a voltage comparison unit which compares a voltage of the input end of the second amplifier with a voltage of the output end of the second amplifier and outputs a comparison result.

2. The source driver according to claim 1, wherein the second amplifier is configured to have a variable output current.

3. The source driver according to claim 2, wherein the second amplifier includes multi-stage amplifiers which are provided in parallel to be able to switch connection and non-connection, and
   wherein the number of connected amplifiers in the multi-stage amplifiers is switched to be able to change an output current.

4. The source driver according to claim 1, wherein the second amplifier includes a non-inverting input end which receives an input of the gradation voltage of the second polarity and an inverting input end which is feedback-connected to the output end, and
   wherein the voltage comparison unit includes a comparator having a first input end connected between the output end of the second gradation voltage generation unit and the non-inverting input end of the second amplifier, a second input end connected between the output end of the second amplifier and the second source output terminal, and an output end outputting a comparison result of a voltage of the first input end and a voltage of the second input end.

5. The source driver according to claim 1, further comprising:
   a data writing unit which writes data corresponding to a specific color display to a third source line and a fourth source line corresponding to source lines different from the first source line and the second source line when the comparison result of the voltage comparison unit shows a predetermined result.

6. The source driver according to claim 5, further comprising:
an interface unit which receives the video data signal and acquires the plurality of pixel data pieces from the video data signal received;
a plurality of latch units which is provided to correspond to the plurality of source lines and latches and outputs the pixel data piece from the interface unit; and
a plurality of gradation voltage generation units which is provided to correspond to the plurality of source lines, includes the first gradation voltage generation unit and the second gradation voltage generation unit, and respectively generates a gradation voltage based on the pixel data piece output from the plurality of latch units,
wherein the interface unit is operated in one of a first operation mode and a second operation mode, supplies a pixel data piece corresponding to the video data signal to the plurality of latch units in the first operation mode, and supplies a pixel data piece corresponding to a first color display to the plurality of latch units regardless of the video data signal in the second operation mode, and
wherein when the interface unit is operated in the second operation mode and the comparison result of the voltage comparison unit shows a predetermined result, the data writing unit supplies a pixel data piece corresponding to a second color display different from the first color display to the latch units corresponding to the third source line and the fourth source line.

7. The source driver according to claim 5,
wherein the third source line is provided at a position adjacent to the first source line and facing the second source line with the first source line interposed therebetween, and
wherein the fourth source line is provided at a position adjacent to the second source line and facing the first source line with the second source line interposed therebetween.

8. A source driver which is connected to a display panel including a plurality of source lines and a plurality of pixel units connected to the plurality of source lines, receives a video data signal including a series of pixel data pieces, and outputs a gradation voltage to be applied to the plurality of pixel units based on the video data signal, the source driver comprising:
a first gradation voltage generation unit which generates a gradation voltage of a first polarity to be supplied to a pixel on a first source line of the plurality of source lines;
a first amplifier which receives an input of the gradation voltage of the first polarity to an input end, amplifies the gradation voltage of the first polarity, and outputs a voltage from an output end;
a first source output terminal which outputs the voltage output from the first amplifier to the first source line;
a first resistor element which is provided between the first amplifier and the first source output terminal and of which one end is connected to the output end of the first amplifier and the other end is connected to the first source output terminal;
a second gradation voltage generation unit which generates a gradation voltage of a second polarity corresponding to a polarity opposite to the first polarity to be supplied to a pixel on a second source line corresponding to a source line provided in the vicinity of the first source line;
a second amplifier which receives an input of the gradation voltage of the second polarity to an input end, amplifies the gradation voltage of the second polarity, and outputs a voltage from an output end;
a second source output terminal which outputs the voltage output from the second amplifier to the second source line;
a second resistor element which is provided between the second amplifier and the second source output terminal and of which one end is connected to the output end of the second amplifier and the other end is connected to the second source output terminal; and
a voltage comparison unit which compares a voltage of the output end of the second amplifier with a voltage of a connection node between the other end of the second resistor element and the second source output terminal and outputs a comparison result.

9. The source driver according to claim 8,
wherein the second amplifier includes a non-inverting input end which receives an input of the gradation voltage of the second polarity and an inverting input end which is feedback-connected to the output end, and
wherein the voltage comparison unit includes a comparator having a first input end connected to the inverting input end and the output end of the second amplifier, a second input end connected between the other end of the second resistor element and the second source output terminal, and an output end outputting a comparison result of a voltage of the first input end and a voltage of the second input end.

10. The source driver according to claim 8, further comprising:
a data writing unit which writes data corresponding to a specific color display to a third source line and a fourth source line corresponding to source lines different from the first source line and the second source line when the comparison result of the voltage comparison unit shows a predetermined result.

11. The source driver according to claim 10, further comprising:
an interface unit which receives the video data signal and acquires the plurality of pixel data pieces from the video data signal received;
a plurality of latch units which is provided to correspond to the plurality of source lines and latches and outputs the pixel data piece from the interface unit; and
a plurality of gradation voltage generation units which is provided to correspond to the plurality of source lines, includes the first gradation voltage generation unit and the second gradation voltage generation unit, and respectively generates a gradation voltage based on the pixel data piece output from the plurality of latch units,
wherein the interface unit is operated in one of a first operation mode and a second operation mode, supplies a pixel data piece corresponding to the video data signal to the plurality of latch units in the first operation mode, and supplies a pixel data piece corresponding to a first color display to the plurality of latch units regardless of the video data signal in the second operation mode, and
wherein when the interface unit is operated in the second operation mode and the comparison result of the voltage comparison unit shows a predetermined result, the data writing unit supplies a pixel data piece corresponding to a second color display different from the first color display to the latch units corresponding to the third source line and the fourth source line.

12. The source driver according to claim 10,
wherein the third source line is provided at a position adjacent to the first source line and facing the second source line with the first source line interposed therebetween, and
wherein the fourth source line is provided at a position adjacent to the second source line and facing the first source line with the second source line interposed therebetween.

13. A display device comprising:
a display panel which includes a plurality of source lines and a plurality of gate lines and a plurality of pixel units respectively provided in a matrix shape at intersection portions of the plurality of source lines and the plurality of gate lines; and
a source driver which receives a video data signal including a series of pixel data pieces and outputs a gradation voltage to be applied to the plurality of pixel units based on the video data signal,
wherein the source driver includes:
a first gradation voltage generation unit which generates a gradation voltage of a first polarity to be supplied to a pixel on a first source line of the plurality of source lines,
a first amplifier which receives an input of the gradation voltage of the first polarity to an input end, amplifies the gradation voltage of the first polarity, and outputs a voltage from an output end,
a second gradation voltage generation unit which generates a gradation voltage of a second polarity corresponding to a polarity opposite to the first polarity to be supplied to a pixel on a second source line corresponding to a source line provided in the vicinity of the first source line,
a second amplifier which receives an input of the gradation voltage of the second polarity to an input end, amplifies the gradation voltage of the second polarity, and outputs a voltage from an output end, and
a voltage comparison unit which compares a voltage of the input end of the second amplifier with a voltage of the output end of the second amplifier and outputs a comparison result.

14. The display device according to claim 13, further comprising:
a short-circuit determination unit which determines whether or not a short-circuit occurs between the first source line and the second source line based on the comparison result of the voltage comparison unit.

15. The display device according to claim 13,
wherein the source driver includes a data writing unit which writes data corresponding to a specific color display to a third source line and a fourth source line corresponding to source lines different from the first source line and the second source line when the comparison result of the voltage comparison unit shows a predetermined result.

16. The display device according to claim 15,
wherein the source driver includes:
an interface unit which receives the video data signal and acquires the plurality of pixel data pieces from the video data signal received,
a plurality of latch units which is provided to correspond to the plurality of source lines and latches and outputs the pixel data piece from the interface unit, and
a plurality of gradation voltage generation units which is provided to correspond to the plurality of source lines, includes the first gradation voltage generation unit and the second gradation voltage generation unit, and respectively generates a gradation voltage based on the pixel data piece output from the plurality of latch units,
wherein the interface unit is operated in one of a first operation mode and a second operation mode, supplies a pixel data piece corresponding to the video data signal to the plurality of latch units in the first operation mode, and supplies a pixel data piece corresponding to a first color display to the plurality of latch units regardless of the video data signal in the second operation mode, and
wherein when the interface unit is operated in the second operation mode and the comparison result of the voltage comparison unit shows a predetermined result, the data writing unit supplies a pixel data piece corresponding to a second color display different from the first color display to the latch units corresponding to the third source line and the fourth source line.

17. The display device according to claim 15,
wherein the third source line is provided at a position adjacent to the first source line and facing the second source line with the first source line interposed therebetween, and
wherein the fourth source line is provided at a position adjacent to the second source line and facing the first source line with the second source line interposed therebetween.

18. A display device comprising:
a display panel which includes a plurality of source lines and a plurality of gate lines and a plurality of pixel units respectively provided in a matrix shape at intersection portions of the plurality of source lines and the plurality of gate lines; and
a source driver which receives a video data signal including a series of pixel data pieces and outputs a gradation voltage to be applied to the plurality of pixel units based on the video data signal,
wherein the source driver includes:
a first gradation voltage generation unit which generates a gradation voltage of a first polarity to be supplied to a pixel on a first source line of the plurality of source lines,
a first amplifier which receives an input of the gradation voltage of the first polarity to an input end, amplifies the gradation voltage of the first polarity, and outputs a voltage from an output end,
a first source output terminal which outputs the voltage output from the first amplifier to the first source line,
a first resistor element which is provided between the first amplifier and the first source output terminal and of which one end is connected to the output end of the first amplifier and the other end is connected to the first source output terminal,
a second gradation voltage generation unit which generates a gradation voltage of a second polarity corresponding to a polarity opposite to the first polarity to be supplied to a pixel on a second source line corresponding to a source line provided in the vicinity of the first source line,
a second amplifier which receives an input of the gradation voltage of the second polarity to an input end, amplifies the gradation voltage of the second polarity, and outputs a voltage from an output end, a second source output terminal which outputs the voltage output from the second amplifier to the second source line, a second resistor element provided between the second amplifier and the second source output terminal and of which one end is connected to the output end of the second amplifier and the other end is connected to the second source output terminal, and a voltage comparison unit which compares a voltage of the output end of the second amplifier with a voltage of a connection node between the other end of the second resistor element and the second source output terminal and outputs a comparison result.

19. The display device according to claim 18, further comprising:
    a short-circuit determination unit which determines whether or not a short-circuit occurs between the first source line and the second source line based on the comparison result of the voltage comparison unit.

20. The display device according to claim 18,
    wherein the source driver includes a data writing unit which writes data corresponding to a specific color display to a third source line and a fourth source line corresponding to source lines different from the first source line and the second source line when the comparison result of the voltage comparison unit shows a predetermined result.

21. The display device according to claim 20,
    wherein the source driver includes:
    an interface unit which receives the video data signal and acquires the plurality of pixel data pieces from the video data signal received, a plurality of latch units which is provided to correspond to the plurality of source lines and latches and outputs the pixel data piece from the interface unit, and a plurality of gradation voltage generation units which is provided to correspond to the plurality of source lines, includes the first gradation voltage generation unit and the second gradation voltage generation unit, and respectively generates a gradation voltage based on the pixel data piece output from the plurality of latch units, wherein the interface unit is operated in one of a first operation mode and a second operation mode, supplies a pixel data piece corresponding to the video data signal to the plurality of latch units in the first operation mode, and supplies a pixel data piece corresponding to a first color display to the plurality of latch units regardless of the video data signal in the second operation mode, and wherein when the interface unit is operated in the second operation mode and the comparison result of the voltage comparison unit shows a predetermined result, the data writing unit supplies a pixel data piece corresponding to a second color display different from the first color display to the latch units corresponding to the third source line and the fourth source line.

22. The display device according to claim 20,
    wherein the third source line is provided at a position adjacent to the first source line and facing the second source line with the first source line interposed therebetween, and
    wherein the fourth source line is provided at a position adjacent to the second source line and facing the first source line with the second source line interposed therebetween.

\* \* \* \* \*